United States Patent [19]
Shields

[11] Patent Number: 5,963,358
[45] Date of Patent: *Oct. 5, 1999

[54] SEMICONDUCTOR DEVICE AND METHOD FOR ITS OPERATION

[75] Inventor: Andrew J. Shields, Cambridge, United Kingdom

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/637,495

[22] Filed: Apr. 25, 1996

[30] Foreign Application Priority Data

| Apr. 26, 1995 | [GB] | United Kingdom | 9508466 |
| Oct. 20, 1995 | [GB] | United Kingdom | 9521401 |
| Oct. 27, 1995 | [GB] | United Kingdom | 9521999 |
| Nov. 28, 1995 | [GB] | United Kingdom | 9524256 |

[51] Int. Cl.⁶ .............................. G02F 1/03; G02F 1/015
[52] U.S. Cl. ....................... 359/248; 359/237; 359/243; 359/244
[58] Field of Search ................... 359/248, 237, 359/243, 244; 385/5, 8

[56] References Cited

U.S. PATENT DOCUMENTS

| Re. 32,893 | 3/1989 | Miller | 250/211 J |
| 4,525,687 | 6/1985 | Chemla et al. | 359/248 |
| 4,597,638 | 7/1986 | Chemla et al. | 350/354 |
| 4,626,075 | 12/1986 | Chemla | 350/354 |
| 4,716,449 | 12/1987 | Miller | 357/30 |
| 4,872,744 | 10/1989 | Abeles et al. | 359/248 |
| 5,414,726 | 5/1995 | Raj et al. | 372/26 |

FOREIGN PATENT DOCUMENTS

| 0 328 214 | 8/1989 | European Pat. Off. . |
| 0 420 749 | 4/1991 | European Pat. Off. . |
| 0 478 060 | 4/1992 | European Pat. Off. . |
| 0 681 200 | 11/1995 | European Pat. Off. . |
| 02063024 | 3/1990 | Japan . |
| 04180036 | 6/1992 | Japan . |

*Primary Examiner*—Georgia Epps
*Assistant Examiner*—Margaret Burke
*Attorney, Agent, or Firm*—Oblon, Spivak, McClelland, Maier & Neustadt, P.C.

[57] ABSTRACT

An optical modulator according to the present invention comprises an optical guide region including a quantum well layer, a waveguide structure defining an optical path of the guide region, a gate situated below the guide region for changing the carrier density in the quantum well layer, an electrical contact for said gate and at least one other electrical contact.

8 Claims, 13 Drawing Sheets

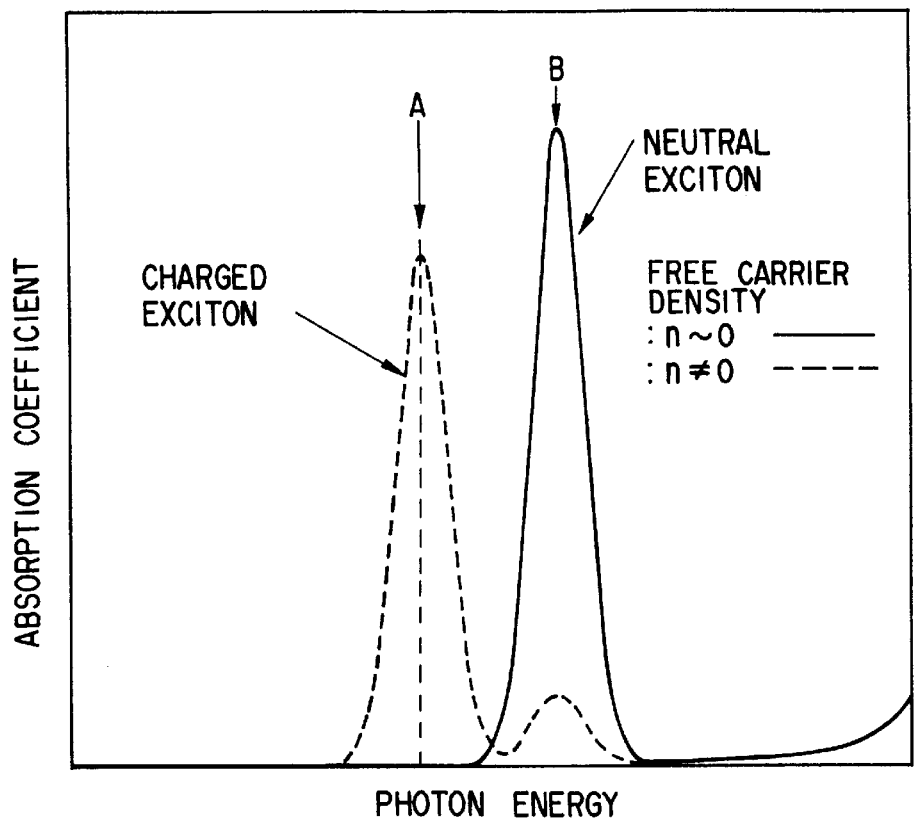
F I G. 1
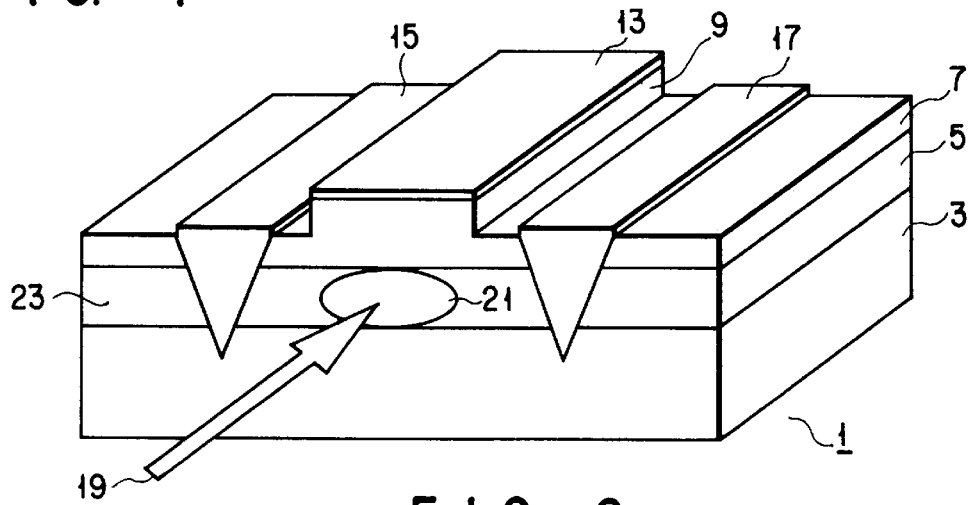
F I G. 2
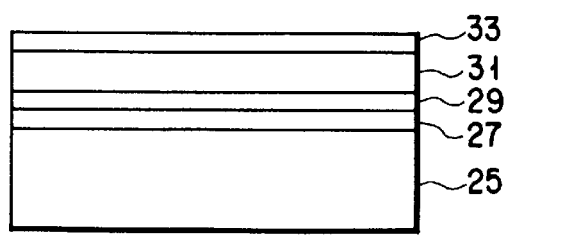
F I G. 3

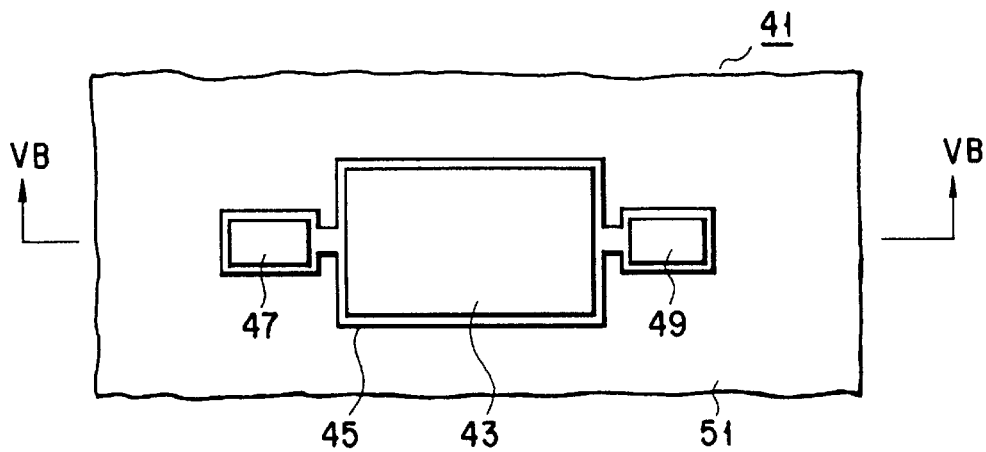
F I G. 5A
F I G. 5B
| 67 | GaAs | | 170 Å CAPPING LAYER | |
|---|---|---|---|---|
| 65 | $Al_{0.33}Ga_{0.67}As$ | Si DOPED $10^{17} cm^{-3}$ | 2000 Å n-TYPE DOPED | |
| 63 | $Al_{0.33}Ga_{0.67}As$ | | 600 Å UNDOPED SPACER | |
| 61 | GaAs | | 300 Å QUANTUM WELL | |
| 59 | $Al_{0.33}Ga_{0.67}As$ | | 200 Å BACK BARRIER | |
| 57 | GaAs | | 0.5 μm | |
| 55 | GaAs(25Å)/AlGaAs(25Å) SUPERLATTICE | | 0.5 μm | BUFFER LAYERS |
| 53 | GaAs | | 1.1 μm | |
| 51 | GaAs SUBSTRATE | | | |
F I G. 6

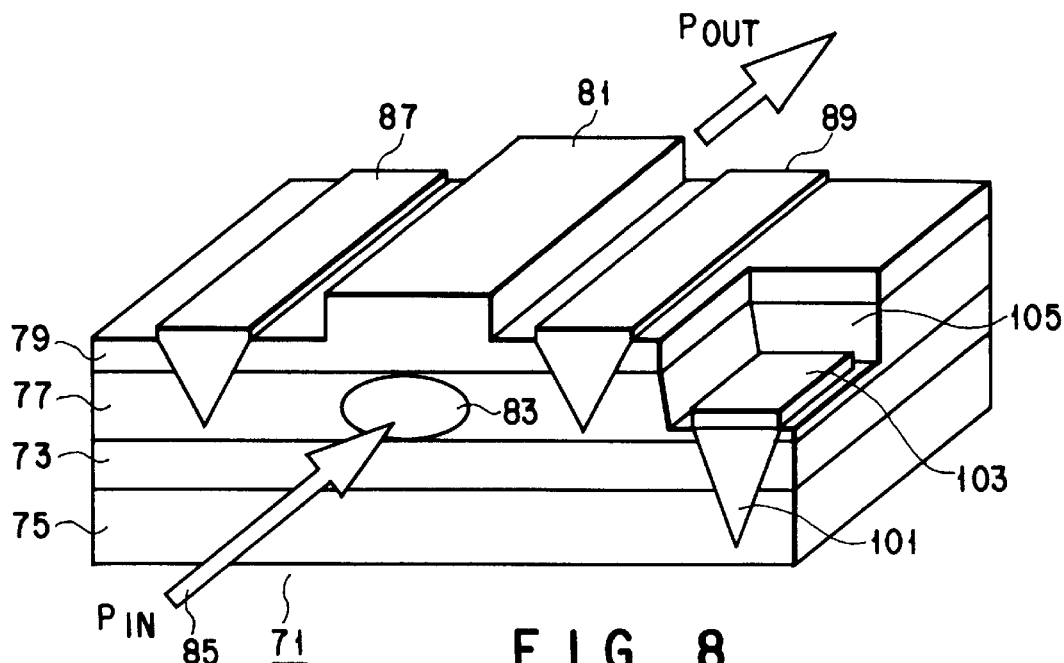
FIG. 8
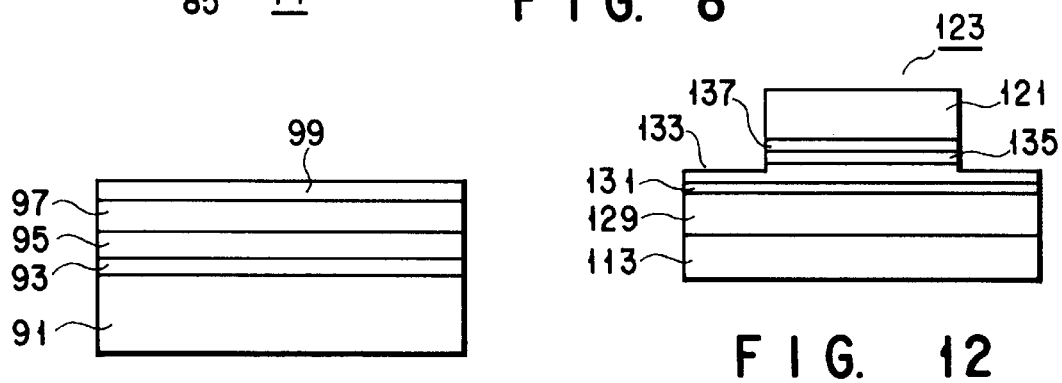
FIG. 9
FIG. 12
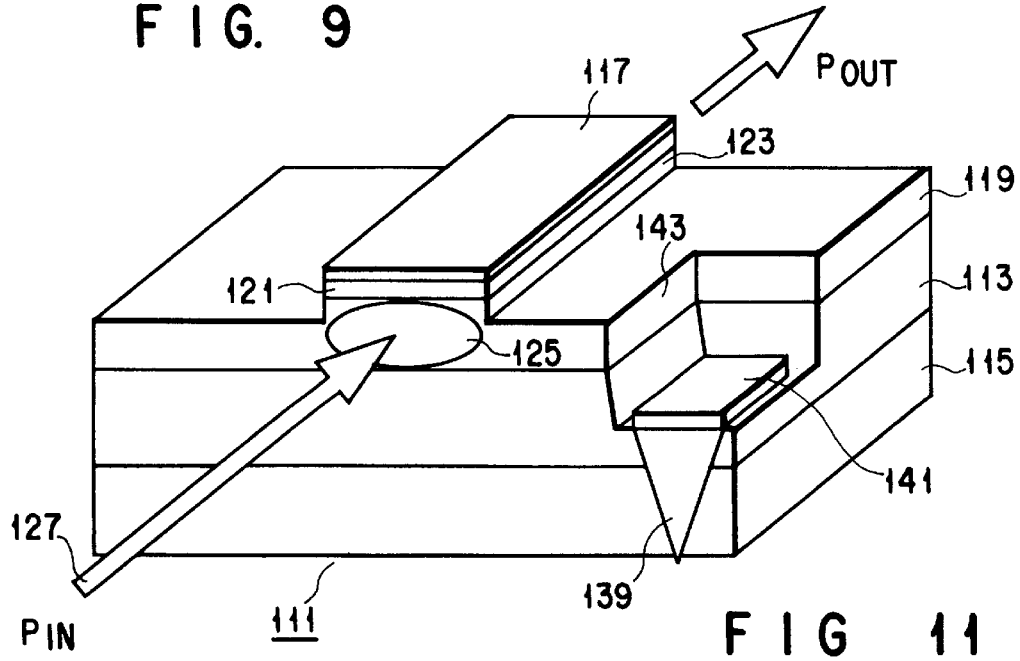
FIG. 11

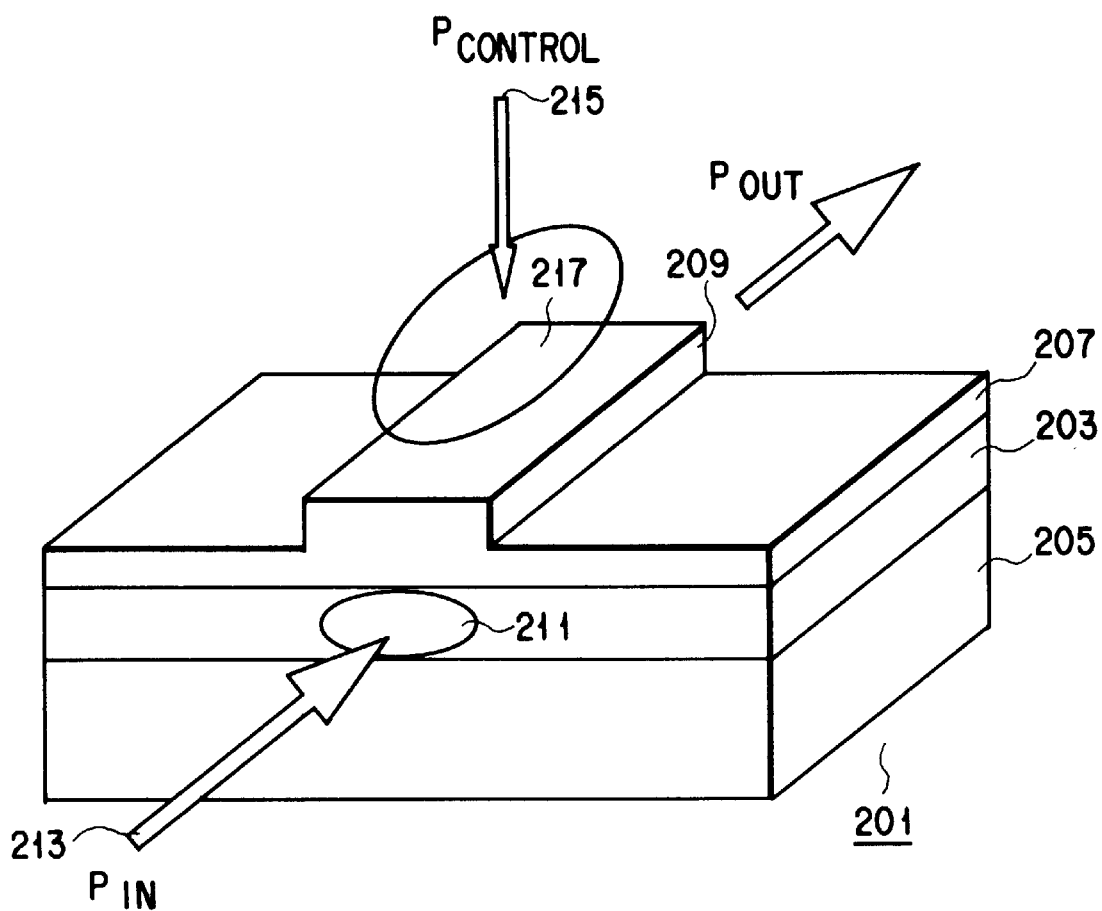
F I G. 13
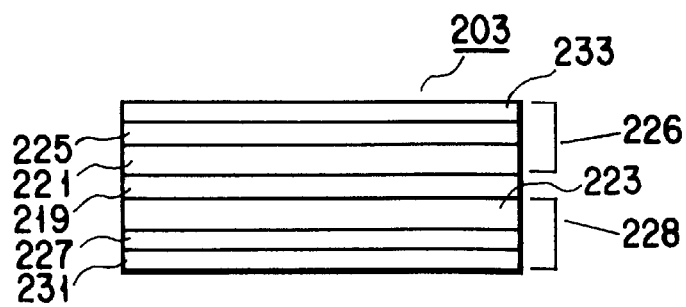
F I G. 14

| 307 | GaAs | CAPPING LAYER |
|---|---|---|
| 305 | $Al_xGa_{1-x}As$ | UPPER BARRIER (UNDOPED) |
| 299 | $Al_xGa_{1-x}As$ | UPPER BARRIER (DOPED p-TYPE) |
| 297 | $Al_xGa_{1-x}As$ | UPPER BARRIER (UNDOPED SPACER) |
| 293 | GaAs | QUANTUM WELL |
| 295 | $Al_xGa_{1-x}As$ | LOWER BARRIER (UNDOPED SPACER) |
| 301 | $Al_xGa_{1-x}As$ | LOWER BARRIER (DOPED p-TYPE) |
| 303 | $Al_xGa_{1-x}As$ | LOWER BARRIER (UNDOPED) |
| 317 | GaAs | SUBSTRATE AND BUFFER LAYERS |

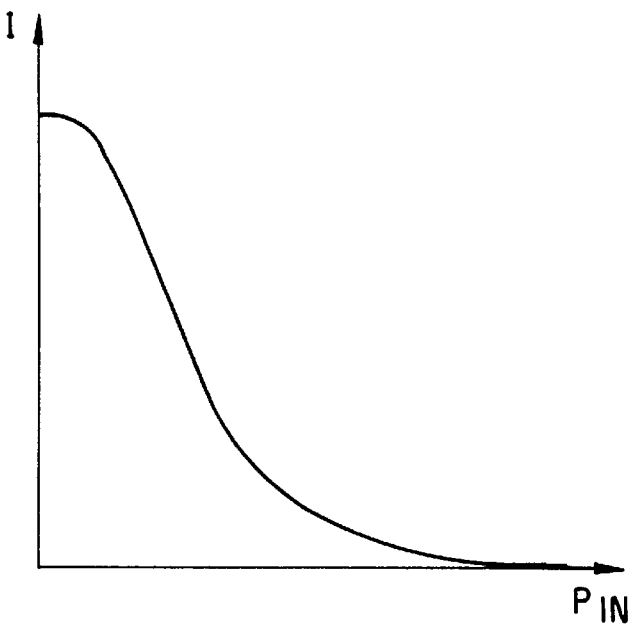
F I G. 24
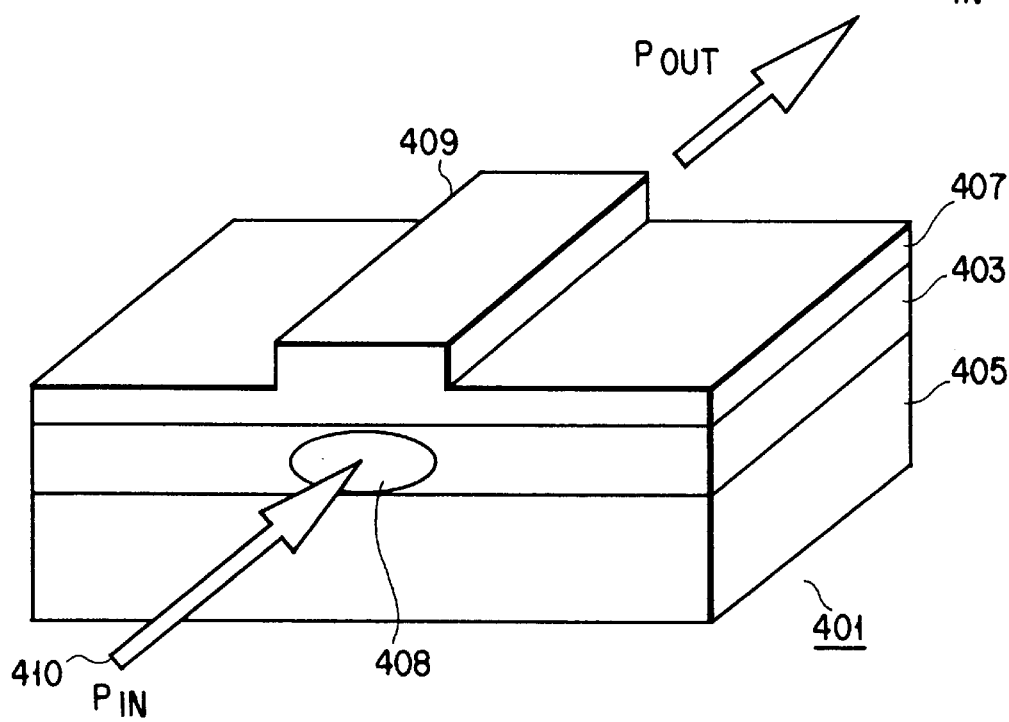
F I G. 25
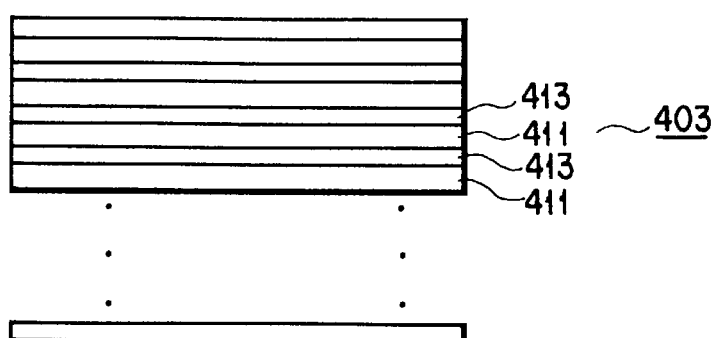
F I G. 26

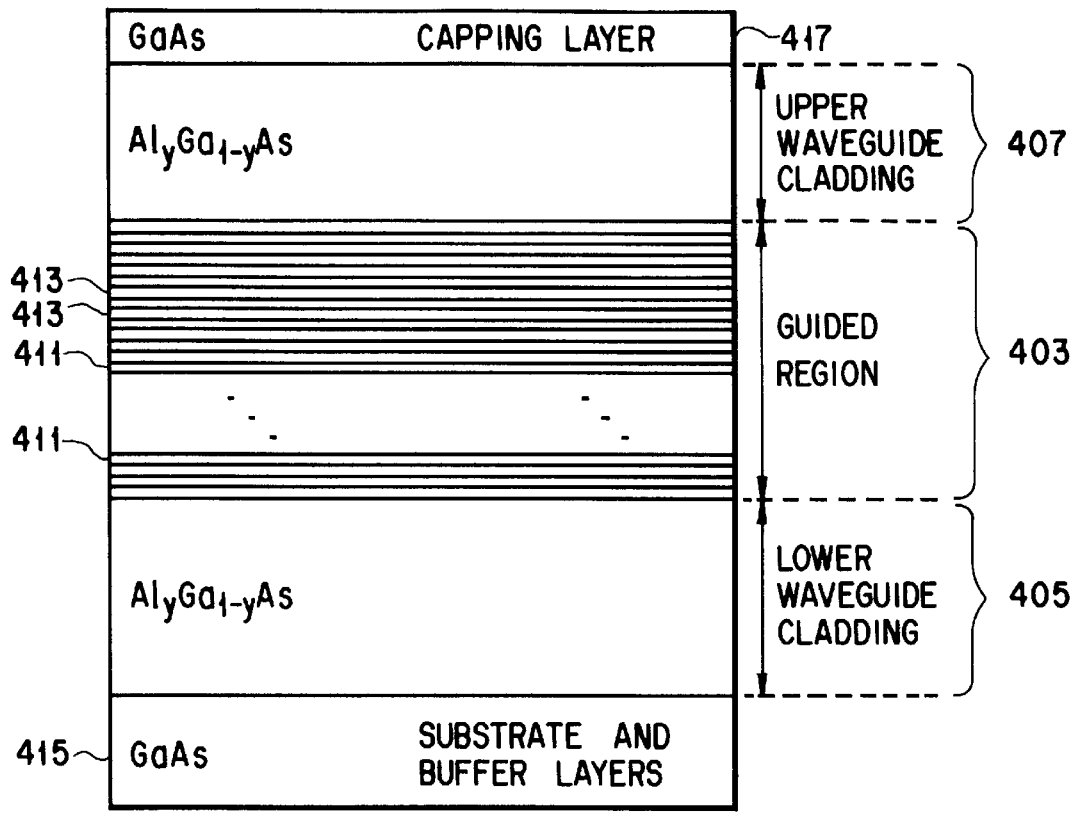
F I G. 27
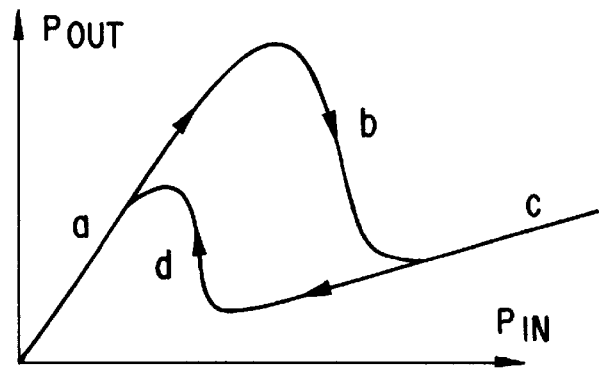
F I G. 28
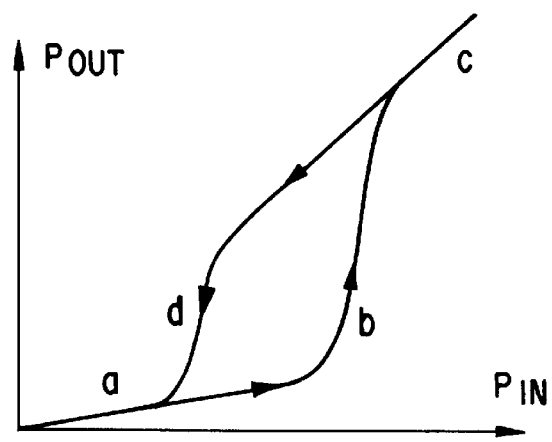
F I G. 29

SEMICONDUCTOR DEVICE AND METHOD FOR ITS OPERATION

BACKGROUND OF THE INVENTION

1. Field of the Invention

The present invention relates to a semiconductor device and a mode of operation for the semiconductor device. In particular, such devices utilize optical properties of charged excitons, and are related to optical devices including an optical modulator, an optical detector and an optical memory displaying bistability.

2. Description of the Related Art

An optical modulator is an electro-optic device where the intensity of a transmitted optical beam is switched between lower and higher values by controlling applied voltage. An efficient optical modulator must have a large contrast between the transparent and opaque states, as well as having low loss in the transparent state.

U.S. Pat. No. U.S. Pat. No. 4,872,744 describes and claims optical modulator comprising a quantum well layer and means in the form of a field effect transistor for altering the density of free carriers within the well layer. The field effect transistor is in the general form of a high electron mobility transistor (HEMT) but configured to guide light through a region containing the well layer. The bias applied to the gate electrode makes the device relatively transparent or opaque to the light in transit.

The device according to the aforementioned US Patent, when operated as described, still absorbs some radiation in the transparent state, even though it absorbs more in the opaque state. This has a number of disadvantages. First, it is impairs the contrast between the opaque and transparent states. Second, it results in higher power being required for the optical input beam. The absorption of the transparent state also restricts the overall length of a waveguide that can be formed containing the device as an integral element, which limits its use in an integrated optical circuit.

The present invention also relates to optically activated semiconductor devices in which an incident optical beam (hereinafter called a "control beam") is either used to generate an electrical signal or else to control the intensity or switching of an optical beam transmitted through the device. A device of the former kind is, of course, an optical detector and a device of the latter kind is an optically activated optical modulator.

The principle of controlling or switching a transmitted beam, using a control beam is described, for example, on U.S. Pat. No. 4,872,744. The control beam is said to change the electron density in a quantum well layer so that at zero—or low carrier density, the device is relatively opaque to a transmitted beam and at higher carrier densities, it is relatively transparent. However, no specific means of putting this into effect appears to be described.

Another device in which a control beam having a photon energy within a quantum well absorption band creates excess carriers within the well and so alters the refractive index of a layer is described in U.S. Pat. No. 4,626,075. This changes the angle deflection of a transmitted beam having a photon energy lower than the bandgap of the quantum well. Therefore, this kind of device acts as a phase modulator.

Another form of optically activated semiconductor device which has a waveguide with a P-I-N structure is described in U.S. Pat. No. 4,716,499. With this device, a control beam is used to generate a photo-voltage which in turn is used to modulate a transmitted beam by changing the biasing condition of the waveguide.

Furthermore, the present invention relates to a bistable optical device which is suitable for uses such as an element in an optical memory.

A semiconductor device which exhibits bistability in its output is disclosed in U.S. Pat. No. 4,716,499. This device relies on generation of a photocurrent to alter the biasing of the device for its bistable behavior.

SUMMARY OF THE INVENTION

It has now been discovered that these disadvantages can be overcome by operating the device in a new mode, in accordance with a first aspect of the present invention, which provides a method of operating an optical modulator which comprises a quantum well layer in an arrangement for altering the density of free carriers within the quantum well layer, which field effect transistor includes a gate electrode, the method comprising applying a variable bias potential between the gate electrode and another electrical contact of the device, and varying the bias potential applied to the gate electrode such that the modulator is substantially transparent to incident light when the carrier density in the quantum well layer is zero or negligible and more opaque to incident light when there is a finite carrier density in the quantum well layer.

The method according to the present invention is applicable both to the conventional device and to a new form of device which will be described further hereinbelow.

The conventional optical modulator has both source and drain contacts to the quantum well layer. In that case, the other electrical contact of the device which is biased relative to the gate electrode may be the drain contact. The source and drain contacts may be held at the same fixed potential. However, optionally, a fixed potential difference can also be applied between the source and drain contacts.

In the new form of optical modulator to be described further hereinbelow, a "back gate" structure is employed, i.e., a gate situated to the other side of the guided region relative to the side on which is situated either the primary gate as used in the conventional device or relative to the side on which is situated a ridge structure. In other words such a back gate is situated on the substrate side of the guided region.

The method of the first aspect of the present invention thus overcomes the disadvantages of the conventional optical modulation mode described in U.S. Pat. No. 4,872,744, since the absorption in the transparent state is greatly reduced. The absorption in the transparent state of this device has two origins. Firstly, there is the residual valence-to-conduction band absorption remaining when excess electrons are added to the quantum well. Secondly, the excess electrons in the well cause absorption due to intra and inter-conduction band transitions. With the method of the first aspect of the present invention, the transparent state is formed with negligible excess electron density in the quantum well, thereby almost eliminating intra- and inter-conduction band absorption by excess electrons in the transparent state. Indeed, the intra- and inter-conduction band absorption is significant only for the opaque state, thereby enhancing the transparent/opaque contrast ratio. Furthermore, the residual valence band-to-conduction band absorption in the transparent state is also reduced since the device is operated at a photon energy below the bandedge neutral exciton line at zero electron density, where the quantum well will be nearly transparent.

Optical excitation of electrons in semiconductors from the valence to conduction band results in a continuum of optical transitions, with a threshold photon energy equal to the bandgap of the material. It is known, that the electron in the conduction band and the "hole" it leaves behind in the valence band feel a mutual Coulombic attraction due to their opposite charge. The interaction leads to an electron-hole bound state being formed (consisting of one electron and one hole), referred to as a (neutral) excision. These neutral excitons produce sharp resonances in the absorption spectrum at a photon energy below the threshold energy of the valence band-to-conduction band continuum. The difference in the continuum threshold and lowest-energy, discrete excitonic transition energy is approximately equal to the binding energy of the electron and hole due to their mutual attraction. For a semiconductor quantum well the interband absorption threshold (at zero electron density) is due to the (neutral) excision formed between the first electron and hole sub-bands.

It has been argued in the aforementioned U.S. Pat. No. 4,872,744 that the absorption at the neutral excitonic transition energy is reduced by adding excess electrons to the quantum well. The absorption has two main components, (1) the ground state neutral exciton and (2) the continuum transition. The reduction in the continuum absorption relies upon the fact that transitions to the bottom of the conduction band are blocked by these states being occupied by electrons. Hence as the electron Fermi energy increases, the effective bandedge threshold is shifted to higher energy (the Burstein-Moss effect).

As described in the US Patent, the continuum absorption is not completely removed, leaving some residual absorption in the transparent state. In fact, this problem is much worse than conventional ones, since the quantum well bandgap shifts to lower energy with increasing electron density, canceling most of the shift of the effective absorption edge to higher transition energy. Hence the absorption of the conventional optical modulator in its "transparent" state would be actually quite significant.

Another source of loss in the transparent state in the conventional device arises from the intra- and inter-conduction band absorption processes, which are also not discussed in that document. This absorption is caused by excess electrons in the conduction band being excited to higher energy states in the same or higher condition bands. An excess electron density of $10^{12}$ cm$^{-2}$ has been estimated to be required to produce the transparent state according to the conventional operation mode in U.S. Pat. No. 4,872,744. That corresponds to a 3D density of $10^{18}$ cm$^{-3}$ in a 100 Å wide quantum well. Adachi, "GaAs and Related Materials", (World Scientific, Singapore, 1994, p441) gives a plot of the absorption coefficient due the inter-conduction band processes in doped bulk GaAs. From this plot the absorption coefficient below the fundamental gap for a density of $10^{18}$ cm$^{-2}$ can be estimated to be roughly 10 cm$^{-1}$.

Although not wishing to be bound by any particular theory or explanation, the applicants believe that the key differences between the conventional mode of operation and that of the present invention are two-fold. First, the conventional device operates at the energy of the neutral band edge exciton in amplitude optical modulation mode and operation according to the present invention is at an energy below this. Furthermore, for operation according to the conventional ones, the transparent and opaque states are formed with finite and negligible electron density in the quantum well, respectively. With the present invention this situation is reversed.

The description hereinbelow of one embodiment of a method according to the present invention concerns a optical modulation device which consists of a waveguide with a central region containing a quantum well layer whose density of free electrons can be varied by application of a voltage between the Schottky gate and drain of an integral field effect transistor. The light propagating through the waveguide is chosen to have an energy below the neutral excitonic absorption of the quantum well when depleted of excess electrons. Hence when the Schottky gate is biased such that there are no electrons in the quantum well, the light can propagate through the waveguide with relatively little attenuation. This corresponds to the transparent state of the device. When excess electrons are added to the quantum well, by changing the gate voltage, the photon energy required for excitonic absorption in the quantum well is lowered, thereby increasing the absorption of the light and turning the device into its opaque state.

There will also be some enhancement of the light absorption when excess electrons are added to the quantum well (opaque state for the present invention) due to inter- and intra-conduction band transitions as described beforehand.

Also, when excess electrons are added to the quantum well, the photoexcited electron and hole can bind a second excess electron, forming a bound complex consisting of two electrons and one hole, referred to as a negatively-charged exciton. The transition energy of the negatively-charged exciton is lower than that of the neutral exciton by an amount roughly equal to the binding energy of the second excess electron to the electron/hole core of the exciton.

FIG. 1 of the accompanying drawings shows the absorption of the quantum well with a negligibly small (solid line) and finite (dashed) electron density in the quantum well. It can be seen that the device is operated at a photon energy below the neutral excitonic energy at zero electron density. Adding excess electrons to the quantum well causes absorption strength to be removed from the neutral exciton and transferred to the negatively charged exciton, which lies to lower energy and lies close to the operating photon energy. Hence, adding excess electrons increases the absorption at the operating photon energy and turns the device into its opaque state.

Hence, the method according to the first aspect of the present invention relies on the ability to increase the absorption of the quantum well by introducing excess electrons to it. The operating photon energy is chosen to be below the neutral exciton resonance with negligible electron density in the quantum well (solid line in FIG. 1). Adding excess electrons (by changing the gate voltage) to the quantum well enhances the formation of negatively-charged excitons and thereby increases the absorption at the operating photon energy (dashed line in FIG. 1). A suitable operating photon energy is marked "A" in FIG. 1.

With the method according to the first aspect of the present invention, in order to achieve the strongest absorption in the opaque state, the optical modulator should be operated (in the opaque state) at the electron density, where the absorption of the negatively-charged exciton is strongest. This will be achieved at a moderate electron density, which can be estimated as follows. A negatively-charged exciton is formed when a photon is absorbed in the vicinity of an excess electron. Hence, as the excess electron density increases, the absorption strength of the negatively-charged excitons increases at the expense of the neutral ones, as the excess electrons cover an increasingly large area of the quantum well. The electron density where the negatively-charged exciton will be formed in nearly all areas of the quantum well, and therefore have maximum absorption strength, can be roughly estimated from the reciprocal of the area of the negatively-charged exciton in the quantum well plane.

Taking the example of a GaAs quantum well and a rough estimate of the in-plane radius of the negatively charged to be twice that of a 3D neutral exciton, yields an excess electron density of about $3 \times 10^{10}$ cm$^{-2}$. This gives a rough estimate of the optimum electron density for the opaque state, which may be improved by a more detailed theoretical analysis and by taking account of the effect of localization of the electrons by spatial inhomogenities.

It will be appreciated that the mode of operation of the present invention can be exactly utilized with conventional optical modulators choosing an appropriate gate bias to obtain a sufficiently low electron density in the well layer to allow utilization of negatively-charged excitons. However, other appropriate structures can be envisaged.

Generally speaking, any heterostructure can be used which allows induction of a so-called two-dimensional electron gas in a quantum well or wells or active layer by virtue of carriers derived from a doped layer or doped layers, and in which light can be transmitted through a region containing the well(s). Optionally, an undoped spacer layer is located between the doped and quantum well layers. However, as the present invention relies on lower electron densities in the quantum well, as compared with the conventional mode of optical modulation, the presence of a spacer layer is preferred. Therefore, such a spacer layer may be relatively thick, e.g., 30 to 100 mm.

Although this discussion of the method of the first aspect of the present invention is in terms of adding excess electrons to the quantum well, it should be noted that optical modulation can also be achieved by introducing excess holes instead. In this case the doped barrier regions close to the quantum well in the field-effect transistor contain a surplus of acceptors rather than donors. This facilitates the density of excess holes in the quantum well to be varied via the gate-drain voltage. Again the operating photon energy is chosen so as to be less than the bandedge excitonic transition with negligible excess hole density in the quantum well (transparent state). Increasing the excess holes density, by altering the gate-drain voltage, causes positively-charged excitons (bound complexes of two holes and one electron) to form in the quantum well. These have a lower transition energy than the neutral excitons, thereby increasing the absorption of the quantum well at the operating photon energy and forming the opaque state of the device. If the hole effective mass is larger than that of the electron, which is the case for most semiconductors, the binding energy of the second hole in a positively-charged exciton will be larger than that of the second electron in a negatively-charged exciton. Hence a device operating with excess holes may provide a larger transparent/opaque contrast ratio than one with excess electrons.

The method of the first aspect of the present invention will be described hereinbelow with reference to a first embodiment using a device generally in accordance with that of conventional ones, i.e., a device in the form of a field effect transistor with source and drain regions contacting the quantum well layer. A Schottky metal gate electrode overlies the quantum well layer between source and drain regions such that a bias voltage applied to the gate controls switching between the transparent and opaque states. The well, spacer and doped layers are disposed between respective cladding layers.

As mentioned above, a new form of optical modulator has now been devised which can be operated in the mode according to the conventional device or in the mode according to the method of the first aspect of the present invention. This device constitutes a second aspect of the present invention which provides an optical modulator comprising an optical guide region including a quantum well layer, a waveguide structure defining an optical path of the guide region, a gate situated below the guide region for changing the carrier density in the quantum well layer, an electrical contact for said gate and at least one other electrical contact.

The waveguide structure of this new form of device preferably comprises a ridge situated above the optical guide region but other forms of waveguide structure are also possible.

Conveniently, in the device according to the second embodiment of the present invention, the electrical contact for the gate is located in a recess penetrating below the quantum well in the guide region. Alternatively, the back gate can be grown directly on highly-doped buffer and substrate layers and an ohmic contact made to the back of the structure.

Two embodiments of an optical modulator according to the present invention are described. In one of these embodiments, the said at least one other electrical contact comprises respective source and drain contacts, making electrical contact to the quantum well in the said guide region, respectively on either side of the ridge. In this device it is possible to deplete areas of the quantum well outside the ridge region, unlike for the previous configuration where a front gate is arranged on top of the ridge. The advantage of this is explained below. However, an additional gate could be formed on top of the ridge. Such a device would then be comparable to the kind of conventional structure, but with an additional back gate.

Nevertheless, if such a further "front" gate is formed on top of the ridge, there is then no need for the source and drain contacts. Such a device constitutes a second embodiment of the device according to the second aspect of the present invention. In the specific form of this embodiment described hereinbelow, the bridge is bounded by recessed regions etched down to extend into the guided region. This is done so that there are no carriers in the optical guide region, outside the edges of the ridge. This is advantageous if the device is operated in the mode of the first aspect of this invention. If the device is to be operated according to the conventional mode, it will be better to terminate the etch within the upper cladding layer, so that the areas of the quantum well outside the ridge remain occupied with carriers.

The advantage of the back gated structure is that all the quantum well can be depleted of carriers, unlike for the front gated device. This is advantageous if the device is operated in the mode of the first aspect of the present invention. This is because, for the front gated device, the areas of the quantum well adjacent and outside the stripe will not be depleted and will therefore absorb a fraction of the light when the device is in the transparent state. This absorption in the transparent state constitutes loss and is undesirable. However, it can be avoided in the back gated device, where all the quantum well above the back gate will be depleted.

As mentioned above, optical modulators according to the second aspect of the present invention can work either in the mode of the conventional device, or in the mode defined by the method of the first aspect of the present invention. However, they are especially advantageous for operation in the latter mode.

Various modifications to this basic optical modulator structure are possible, for example:

(1) The device described in the embodiments produces amplitude modulation where the absorption coefficient is changed at the operating photon energy. However, the principles outlined here can also be employed to produce a device working on the principle of phase modulation, relying on a small change in the refractive index. In this case a smaller operating photon energy is used which lies within the forbidden gap of the quantum well so reducing the absorption losses even further. On the other hand, such a device has the potential disadvantage that longer device lengths are required to produce comparable modulation. This applies both to devices according to the second aspect of the present invention and any optical modulator intended for operation by the method of the first aspect of the present invention.

(2) For those embodiments which employ a metal Schottky gate on top of a ridge structure, the Schottky gate could be replaced by a doped semiconductor layer grown epitaxially along with the rest of the structure.

(3) The dopant atoms could be placed in the $Al_xGa_{1-x}As$ layer below, rather than, or in addition to, those above, the quantum well.

(4) The undoped spacer layer can be omitted.

(5) p-type dopants could be used instead of n-type. In this case, excess holes are supplied to the quantum well, leading to the formation of positively-charged excitons.

(6) The upper cladding layer can be omitted or replaced by a dielthanic with smaller refractive index than the guided region. This may be preferable if an $Al_xGa_{1-x}As$ cladding layer is used, having a large background impurity concentration.

(7) A short-period superlattice structure (e.g., 50 periods in GaAs (25 Å)/$Al_{0.3}Ga_{0.7}As$ (25 Å) for the GaAs structure outlined here) can be grown before the quantum well layer, in order to improve the quality of the quantum well layer.

The modulator in use may be incorporated into an external waveguide structure for use as a discrete device or integrated into an optical circuit. It can be combined with other circuitry to form optical logic elements, as known to those skilled in the art.

The semiconductor layers of the device can be produced by a number of different methods, although epitaxial growth methods such as MOVPE, MOCVD, MBE, etc., are preferred.

A new form of optically activated semiconductor device has now been devised, in accordance with the third aspect of the present invention which provides an optically operable semiconductor device comprising a modulation region which comprises a quantum well layer formed of semiconductor material having a predetermined bandgap and at least one barrier region formed of semiconductor material having a higher bandgap than said predetermined bandgap such that when the at least one barrier region is irradiated with an incident light beam having a photon energy higher than the bandgap of said at least one barrier region, the excess carrier density in the quantum well layer is altered.

Hereinbelow are described, both embodiments of optically activated optical modulators and of an optical detector, all in accordance with the third aspect of the present invention. The optical modulators are capable of operating in the conventional mode of operation, i.e., so that the control beam changes the electrical density in the quantum well layer so that at zero-or low carrier density, the device is relatively opaque to the transmitted beam and at higher carrier densities, it is relatively transparent. However, these optical modulators according to the present invention are also capable of operating in a different mode. This different mode is described in the first aspect of the present invention. It causes the modulator to be substantially transparent to transmitted light when the carrier density in the quantum well layer is zero or negligible and to be more opaque to the light when there is a finite carrier density in the quantum well layer, thereby enhancing the transparent/opaque contrast ratio.

Instead of modulating the intensity of the transmitted beam, the device can also be fabricated so that the control beam alters the refractive index of the device at the photon energy of the transmitted beam. In this way, the device acts as a phase modulator.

In another variant of the third aspect of the present invention, a photovoltage can be generated by the control to change the gate bias of a device with gate and ohmic contacts and hence the electron density in the quantum well and hence the transmission of a beam traveling through the waveguide. To the conventional operation described in U.S. Pat. No. 4,716,499, except in the latter device the photovoltage changes the electric field across the quantum well, whilst with the present invention it changes the electron density in the quantum well.

Optically activated optical modulators according to the present invention which are intensity (amplitude) modulators fall into two distinct classes, in terms of their mechanism of operation for modulating the intensity of a light beam transmitted through the waveguide region. For one of these classes, the incident light beam (i.e., the control beam) functions to decrease the excess carrier density in the quantum well layer. In the other class of modulator, the control beam functions to increase the excess carrier density in the quantum well layer.

In the embodiments of optically activated optical modulator described hereinbelow, the optical path through the modulation region of the device is defined by a stripe waveguide structure, although in principle, any known optical waveguide structure may be employed in a detector as according to the present invention. Alternatively, the waveguide structure can be dispensed with altogether and the transmitted beam can impinge at a normal or oblique angle to the upper surface of the device.

In the first class of optically activated optical modulator according to the third aspect of the present invention, i.e., that in which the control beam functions to decrease excess carrier density in the quantum well layer, the modulation region further comprises a first doped barrier layer. However, preferably, the modulation region also comprises a second doped barrier layer and the quantum well layer is situated between the first and second doped barrier layers. In the embodiment described to exemplify this class of device, the quantum well layer is separated from the first and second doped barrier layers by respective spacer layers. In this device, the first and second doped barrier layers are doped so as to have the same conductivity type.

In the second class of optically activated optical modulator according to the third aspect of the invention, i.e., that in which the control beam function to increase the excess carrier density in the quantum well layer, the layer structure of the device is such as to develop an electric field across the modulation region. This can be achieved by the modulation region being situated between first and second doped layers, respectively of different conductivity types. In a described embodiment, the modulation region is separated from these first and second doped layers by respective first and second cladding layers. However, the same effect can be achieved by, e.g., a p-i-n, n-i-p, (Schottky metal)-i-p, (Schottky metal)-i-n layer structures or any other means well known to those skilled in the art.

In the embodiment described to exemplify this second class of optically activated optical modulator according to the third aspect of the invention, one of the first and second doped layers forms part of a stripe waveguide structure.

Optionally, respective ohmic contact can be made to the first and second doped layers so that a voltage applied between them may be used to increase the electric field across the waveguide region. This can have the benefit of reducing switching time, as will be explained in more detail hereinbelow. The doped layer which is on the substrate side of the waveguide region can conveniently be contacted by an ohmic contact located in a recessed portion of the waveguide region. It is also possible to make ohmic contact via the back of the substrate if the lower doped region is grown on buffer and substrate layers of same doping type.

In optical detectors according to the third aspect of the present invention, the incident light beam functions to generate an electrical signal from output terminals which are in electrical contact with the quantum well layer (effectively like source and drain ohmic contacts to a quantum well layer in a high electron mobility transistor (HEMT)). In a described embodiment of such a detector, the light beam functions to decrease the excess carrier density in the quantum well layer. This device further comprises a first doped barrier layer, although preferably, it also comprises a second doped barrier layer and the quantum well layer is situated between these two doped barrier layers. The two doped barrier layers are doped to have the same conductivity type. As described, the quantum well layer is separated from the two doped barrier layers by respective spacer layers.

Optionally, a gate electrode is overlying the structure (between the source and drain-like electrical contacts) to alter or enhance the electrical field in the upper barrier region. Additionally or alternatively, a back gate (i.e., substrate side) could be formed between the front of the lower barrier region in a similar manner. This is also optionally applicable to modulation according to the present invention.

The aforementioned kind of optical detector may be reconfigured to detect light using a second optical beam by incorporating a waveguide structure so that it provides an optical rather than electrical output signal. Furthermore, the structure may be utilized as a discrete device or integrated into an array for image detection purposes.

A new type of bistable optical device (which need not have contacts) has now been devised, which depends on a different mechanism of operation for producing bistability from a conventional one described in U.S. Pat. No. 4,716,499, for example. Thus, a fourth aspect of the present invention provides a bistable optical element comprising an optical path region including a quantum well layer disposed between respective barrier layers of higher bandgap semiconductor material than the quantum well layer, whereby absorption of an optical beam in the optical path region creates excess electrons and holes in the quantum well layer, thereby modifying absorption in the optical path region to create bistability.

In this device according to the fourth aspect of the invention, absorption will be enhanced if more than one quantum well layer is provided, i.e., at least two quantum well layers. For a device with a waveguide geometry the optical path region must have a thickness for propagation of the optimum mode, and will thus accommodate around 5 to 50, i.e., about 20, quantum well layers.

Thus, a fifth aspect of the present invention provides a bistable optical element comprising an optical path region including a plurality of quantum well layers alternating with respective barrier layers of higher bandgap semiconductor material than the quantum well layers, for providing bistability in the emergent intensity of an optical beam transmitted through the optical path region.

Resonant absorption of light creates photo-excited electrons and holes in the structure. The excess carriers modify the absorption of the material, producing bistable behavior.

The mode of operation utilized by devices according to the present invention may also be used in known kinds of optical device which have a quantum well layer, provided that the conditions (e.g., photon energy of the transmitted beam, bandgaps of the quantum well and barrier layers, voltages applied to any gates or ohmic contacts) are chosen such that the resonant absorption of the beam generates excess holes and electrons to modify the absorption characteristic. Thus, a sixth aspect of the present invention provides a method of providing bistability in the emergent intensity of an optical beam transmitted through the optical path region of a device in which the optical path region comprises a quantum well layer disposed between respective barrier layers of higher bandgap semiconductor material than the quantum well layer, the method comprising operating the device under conditions such that absorption of the optical beam in the optical path region creates excess electrons and holes in the quantum well layer to modify the absorption in the optical path region.

The bistable optical element of the present invention can be operated in two modes (as will be explained further hereinbelow), using light with a photon energy, either, close to that of the neutral exciton, or the charged excitons. FIG. 1 shows that a large change in absorption can be achieved at either the photon energy of the charged exciton (which from now on will be referred to as operating photon energy A) or that of the neutral exciton (operating photon energy B).

In a preferred embodiment of a bistable element according to the present invention described hereinbelow, a waveguide structure is provided for defining an optical path for an optical beam, through the optical path region. This may be of any kind of waveguide structure known to those skilled in the art, although in this particular embodiment it is a stripe waveguide. However, the waveguide structure may be dispensed with altogether and the optical beam may be directed at an angle substantially normal to, or at an oblique angle to, the quantum well layers. In the case of a structure grown on an absorbing substrate, a window would need to be etched for transmission of the beam, using techniques well known to those skilled in the art.

Any bistable optical device according to the present invention may include means for generating or detecting the optical beam.

As indicated above, the bistable optical device may operate in two different optical modes, either with a light source having a photon energy corresponding to or in the region of, the energy of charged excitons, or else corresponding to, or in the region of neutral excitons.

The bistable optical device according to the present invention may be used as an optical analog of a memory element, flip-flop, shift register or any other optical equivalent of electronic circuits which utilize one or more bistable components. In the case of, e.g., a memory element, a device may comprise an array of such memory elements.

The preferred embodiment of a bistable element according to the present invention uses a GaAs/$Al_xGa_{1-x}As$ heterostructure in which the multiple quantum well region consists of alternating GaAs and $Al_xGa_{1-x}As$ (x=0.33) layers, with thicknesses of 150 Å and 100 Å, respectively. However, the GsAs layers preferably have any thickness in the range of 50 to 500 Å and the $Al_xGa_{1-x}As$ barriers 20 to 500 Å.

In the preferable embodiment of a bistable optical element, the multiple quantum well occupies the whole thickness of the optical path region, although it can also be limited to just the central region of the guided region where the optical mode is most intense by arranging thicker $Al_xGa_{1-x}As$ layers on either side of the multiple quantum well. The guided region preferably has a total thickness of about 0.2 to 1.0 µm, while the upper and lower cladding layer is preferably $Al_{0.5}Ga_{0.5}As$ of 0.5 to 2 µm thickness. The ridge is preferably about 1 to 5 µm wide, etched to leave about 0.3 µm of the upper cladding layer.

In the preferred embodiment of a bistable optical element, the guided region has a thickness of 0.51 µm and consists of 20 GaAs wells interspersed with 21 $Al_{0.33}Ga_{0.69}As$ barriers. However, as mentioned above the number of wells can be reduced and the thickness of the outermost barrier layers increased to keep the total thickness of the guided region 0.2 to 1.0 µm.

All described embodiments of the present invention are based on a $GaAs/Al_xGa_{1-x}As$ heterostructure. However, the layers could be formed from a number of different materials. Nevertheless, those with strong bandedge excitonic resonances are preferred, e.g., $InP/In_xGa_{1-x}AS$, $In_xGa_{1-x}As/In_yAl_{1-y}As$, $InP/In_xAl_{1-x}As$, $In_xGa_{1-x}As/GaAs$, $GaInP/AlGaInP$, $CdTe/Cd_xZn_{1-x}Te$, $CdTe/Cd_xMn_{1xx}Te$, $ZnSe/Zn_{1-x}Mn_xSe$, $Zn_{1-x}Cd_xSe/ZnSe$, $Zn_{s_y}Se_{1-y}/Zn_{1-x}Cd_xSe$, $CdTe/Cd_{1-x}Zn_xTe$, $GaN/AlN$, $GaN/Al_xGa_{1-x}N$, $In_xGa_{1-x}N/GaN$, $In_xGa_{1-x}N/Al_yGa_{1-y}N$ etc.

For the avoidance of doubt, in the context of the present invention, the term "optical" means pertaining to electromagnetic radiation of ultra-violet visible or infrared frequencies and the term "light" is to be interpreted correspondingly.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and illustrate a part of the specification, illustrate presently preferred embodiments of the present invention and, together with the general description given above and the detailed description of the preferred embodiments given below, serve to explain the principles of the present invention in which:

FIG. 1 shows absorption spectra for neutral and charged excitons;

FIG. 2 shows a schematic partial cross-sectional view of a first embodiment of an optical modulator for operation in accordance with the first aspect of the present invention;

FIG. 3 shows a schematic cross-sectional view of the guided region waveguide structure of the modulator shown in FIG. 2;

FIGS. 5A and 5B show a schematic plan view of a second embodiment of an optical modulator for operation in accordance with the first aspect of the present invention and a cross-sectional view of the modulator shown in FIG. 5A;

FIG. 6 shows details of the layer structure of the modulator shown in FIGS. 5A and 5B;

FIG. 8 shows a schematic partial cross-sectional view of a third embodiment of an optical modulator which is in accordance with the second aspect of the present invention;

FIG. 9 shows a schematic cross-sectional view of the guided region waveguide structure of the modulator shown in FIG. 8;

FIG. 11 shows a schematic partial across-sectional view of a fourth embodiment of an optical modulator which is in accordance with the second aspect of the present invention; and FIG. 12 shows a schematic cross-sectional view of the guided region waveguide structure of the modulator shown in FIG. 11.

FIG. 13 shows a sectional perspective view of a fifth embodiment of an optically activated optical modulator according to the third aspect of the present invention;

FIG. 14 shows details of the waveguide region of the device shown in FIG. 13;

FIG. 24 shows the source-drain current as a function of incident light intensity for the device shown in FIGS. 22 and 23;

FIG. 25 shows a sectional perspective view of a seventh embodiment of a bistable optical element according to the present invention;

FIG. 26 shows details of the optical path region for the element shown in FIG. 25;

FIG. 27 shows the complete layer structure for the element shown in FIGS. 25 and 26;

FIG. 28 shows bistable operation of the element shown in FIGS. 25 to 27 in charged exciton mode; and FIG. 29 shows bistable operation for the element shown in FIGS. 25 to 27 in neutral exciton mode.

DETAILED DESCRIPTION OF THE PREFERRED EMBODIMENTS

Figure 4:
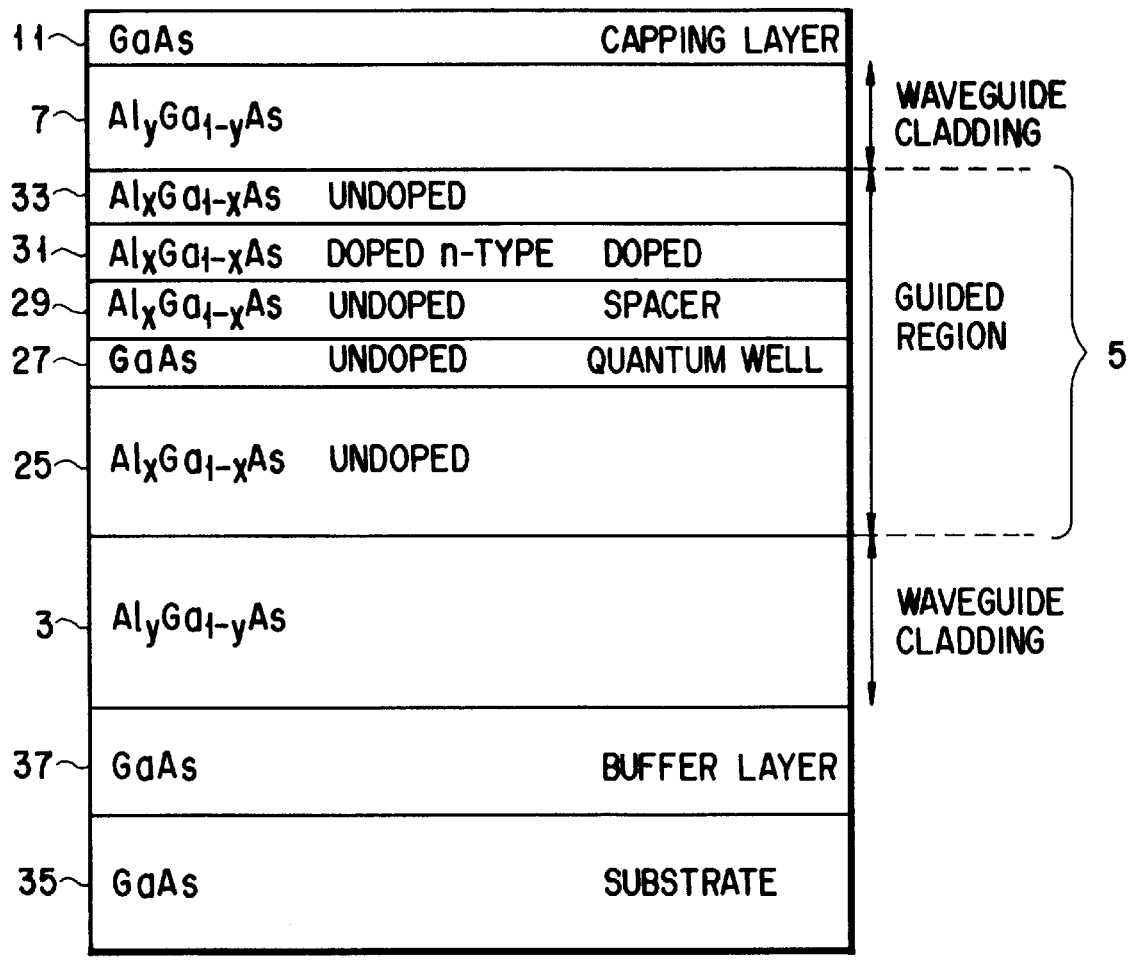
FIG. 4 shows details of the layer structure of the modulator shown in FIGS. 2 and 3.

FIG. 2 shows the basic structure of a first embodiment of an optical modulator 1 for operation according to the first aspect of the present invention. The modulator 1 comprises a lower cladding layer 3 above which is situated a waveguide region 5. Above the waveguide region 5 is an upper cladding layer 7.

The upper cladding layer 7 is selectively etched to produce a raised ridge 9 and a metal Schottky gate electrode 13 is formed over the ridge 9.

Respectively on either side of the ridge 9 are formed by conventional techniques, a source ohmic contact 15 and a drain ohmic contact 17 which penetrate the upper cladding layer 7 to permit electrical contact with the quantum well in the guided region 5 of the waveguide.

As will be explained in more detail hereinbelow, a light beam 19 travels through a propagation region 21 of the waveguide region 5, directly under the ridge 9 and Schottky gate, parallel to and between the source and drain ohmic contacts 15, 17. The intensity and/or phase of the beam 19 exiting from the face (not shown) remote from the entry face 23 is modulated according to means of applied potentials.

The layer structure of the waveguide region 5 is shown in FIG. 3. It comprises a lower undoped barrier 25 below a quantum well or active layer 27. A middle undoped barrier or spacer layer 29 (which can be omitted) is situated above the quantum well layer 27 and a doped (p-type or n-type) barrier layer 31 is formed over the middle undoped barrier layer 29. Finally, an upper undoped barrier layer 33 (which can be omitted) is situated above the doped barrier layer 31.

FIG. 4 shows the full layer arrangement of the structure shown in FIG. 2, including the structure details of the waveguide region as shown in FIG. 3. However, FIG. 4 also shows that the structure of FIG. 2 is formed on a substrate 35, a buffer layer 37 is interposed between the substrate 35 and the lower cladding layer 3, and that a GaAs layer (11) caps the growth after the upper cladding layer (7). The composition and thickness of each layer shown in FIG. 4, is as listed in Table 1 hereinbelow.

TABLE 1

STRUCTURE OF DEVICE SHOWN IN FIG. 4

| LAYER | MATERIAL | THICKNESS | IMPURITY CONC(cm$^{-3}$) |
| --- | --- | --- | --- |
| Capping layer 11 | GaAs | 10 nm | — |
| Upper cladding layer 7 | Al$_y$Ga$_{1-y}$As | 0.5 μm | — |
| Upper barrier layer 33 | Al$_x$Ga$_{1-x}$As | 40 nm | — |
| Doped barrier layer 31 | Al$_x$Ga$_{1-x}$As | 0.2 μm | Si 10$^{17}$ |
| Middle barrier (spacer) layer 29 | Al$_x$Ga$_{1-x}$As | 60 nm | — |
| Quantum well layer 27 | GaAs | 20 nm | — |
| Lower barrier layer 25 | Al$_x$Ga$_{1-x}$As | 0.3 μm | — |
| Lower cladding layer 3 | Al$_y$Ga$_{1-y}$As | 2 μm | — |
| Buffer layer 37 | GaAs | 1 μm | — |
| Substrate 35 | GaAs | unspec. | — |

In Table, 1 x = 0.3; y = 0.5

The complete structure is fabricated using a conventional epitaxial growth method. The thickness of the quantum well layer 27 is chosen to provide sharp excitonic resonances and with this particular heterostructure, could be any thickness from 3 nm to 50 nm. The carriers in the quantum well layer are of course induced by the doped barrier layer 33. Therefore, the thickness of the spacer layer 29 and of the doped barrier layer 33, as well as the doping concentration of the latter, are chosen to allow the electron density to be varied between zero and the value for maximum absorption in the opaque state.

Referring again to FIG. 3, the waveguide structure 5 consists of a central guided region sandwiched above and below by cladding layers 3, 7 with a smaller refractive index than the average refractive of the guided region. For the GaAs/Al$_x$Ga$_{1-x}$As heterostructure illustrated here, this can be achieved by composing the cladding regions 3, 7 of Al$_x$Ga$_{1-x}$As having a larger average Al concentration (e.g., x=0.5) than in the guided central region. For optimum performance the thickness of the central region should be kept sufficiently narrow that only the fundamental optical mode is supported and with the quantum well layer 27 at the maximum intensity of the optical mode. The cladding layers 3, 7 should be sufficiently thick so as to prevent significant leakage of the optical mode from the guided region.

The cladding layers 3, 7 on top of and below the guided region confine the optical mode in the direction normal to the layer planes. FIG. 3 illustrates just one possible method of confining the optical mode in the direction perpendicular to the growth direction, i.e., in a structure commonly referred to as a stripe waveguide. The processing steps required to form a strip waveguide are well known and need not be detailed here. However, other waveguide structures, known to those skilled in the art, are also suitable.

The stripe is etched into the upper cladding layer 7 using dry or wet-etching through a photolithographical mask. Since the refractive index within the strip region is larger than that in the adjacent etched region, the optical mode will be confined under the stripe region. The stripe can be about 1 to 5 μm wide and the etch depth is such that about 0.3 μm of the upper cladding layer 7 remains in the etched region.

The Schottky metal contact 13 is evaporated on top of the stripe using standard techniques in order to act as the gate for the field effect transistor. The ohmic source and drain contacts 15, 17 to the electron gas in the quantum well layer 27 are made using standard techniques on either side of the stripe forming the source and the drain of the field effect transistor. The electron density in the quantum well is varied by applying a voltage between the Schottky and drain contacts of the device. A second (optional) voltage is also supplied between the source and drain ohmic contacts so as to enhance the drift velocity of electrons traveling in the quantum well channel. This reduces the transit time for the electrons from the quantum well to the ohmic contact when a Schottky bias is applied so as to deplete the quantum well and thereby enhance the speed of the device. Maximum drift velocity is achieved in GaAs for an electric field of about 3.5 KV/cm.

FIGS. 5A and 5B show a general schematic of a second embodiment of an optical modulator 41 for operation according to the first aspect of the present invention. It is generally analogous to the device shown in FIGS. 2 and 3.

A Schottky metal gate 43 is formed over the central area of a mesa region 45 and source 47 and drain 49 are formed at either end of the mesa 45 outside the gate 43 as ohmic contacts to a buried quantum well layer which will be described in more detail hereinbelow.

The mesa 45 is formed on a wafer 51 by defining a masked area using standard photolithography and then etching the exposed semiconductor to a depth below the quantum well layer. Photolithography is employed to deposit NiGeAu metal at either end of the mesa 45 which is then annealed to form the ohmic contacts 47, 49 to the electrons in the quantum well layer.

A semi-transparent Au layer is evaporated onto the central region of the mesa 45 to form the Schottky gate 43.

As illustrated and described, this device does not include a waveguide structure. However, it is to be understood that for operation as a modulator, a waveguide structure should also be incorporated, in the manner of the first embodiment.

Details of the layer structure within the mesa 45 are shown in FIG. 6. The order of growth on a substrate 51 is as follows: lower buffer layer 53, middle buffer layer 55, upper buffer layer 57, lower barrier layer 59, quantum well layer 61, undoped spacer layer 63, n-doped layer 65 and finally, capping layer 67. The composition and thickness of each layer as shown in FIG. 6 is listed in Table 2 hereinbelow.

TABLE 2

STRUCTURE OF DEVICE SHOWN IN FIG. 6

| LAYER | MATERIAL | THICKNESS | IMPURITY CONC(cm$^{-3}$) |
|---|---|---|---|
| Capping layer 67 | GaAs | 17 nm | — |
| Doped barrier layer 65 | Al$_x$Ga$_{1-x}$As | 200 nm | Si 10$^{17}$ |
| Spacer layer 63 | Al$_x$Ga$_{1-x}$As | 60 nm | — |
| Quantum well layer 61 | GaAs | 30 nm | — |
| Lower barrier layer 59 | Al$_x$Ga$_{1-x}$As | 20 nm | — |
| Upper barrier layer 57 | GaAs | 0.5 μm | — |
| Middle buffer layer 55 | Superlattice* | 0.5 μm | — |
| Lower buffer layer 53 | GaAs | 1.1 μm | — |
| Substrate 51 | GaAs | unspec. | — |

In Table 2, x = 0.33.
The superlattice* is GaAs(2.5 nm)/AlGaAs(2.5 nm).

The device of this second embodiment can be seen to be similar to that of the first embodiment. In particular, it has similar quantum well, undoped spacer and doped layers. The layers were grown by molecular beam epitaxy on a (100) oriented GaAs substrate. None of the layers were intentionally doped, expect for the 2000 Å doped Al$_{0.33}$Ga$_{0.67}$As layer. The layer thickness and doping concentrations in FIG. 6 are the nominal values determined from the growth flux rates. Waveguide cladding layers are omitted from FIG. 6 but these do not affect the light absorbing properties, although they will alter the operating voltage. The thickness of the back barrier layer is thinner than in the first embodiment. However, similar performance was obtained with samples with a thicker back barrier layer.

The excess electron density in the quantum well can be varied by biasing the Schottky gate with respect to the ohmic contacts. A negative applied gate voltage is required to deplete nearly all the electrons from the quantum well.

Figure 7:
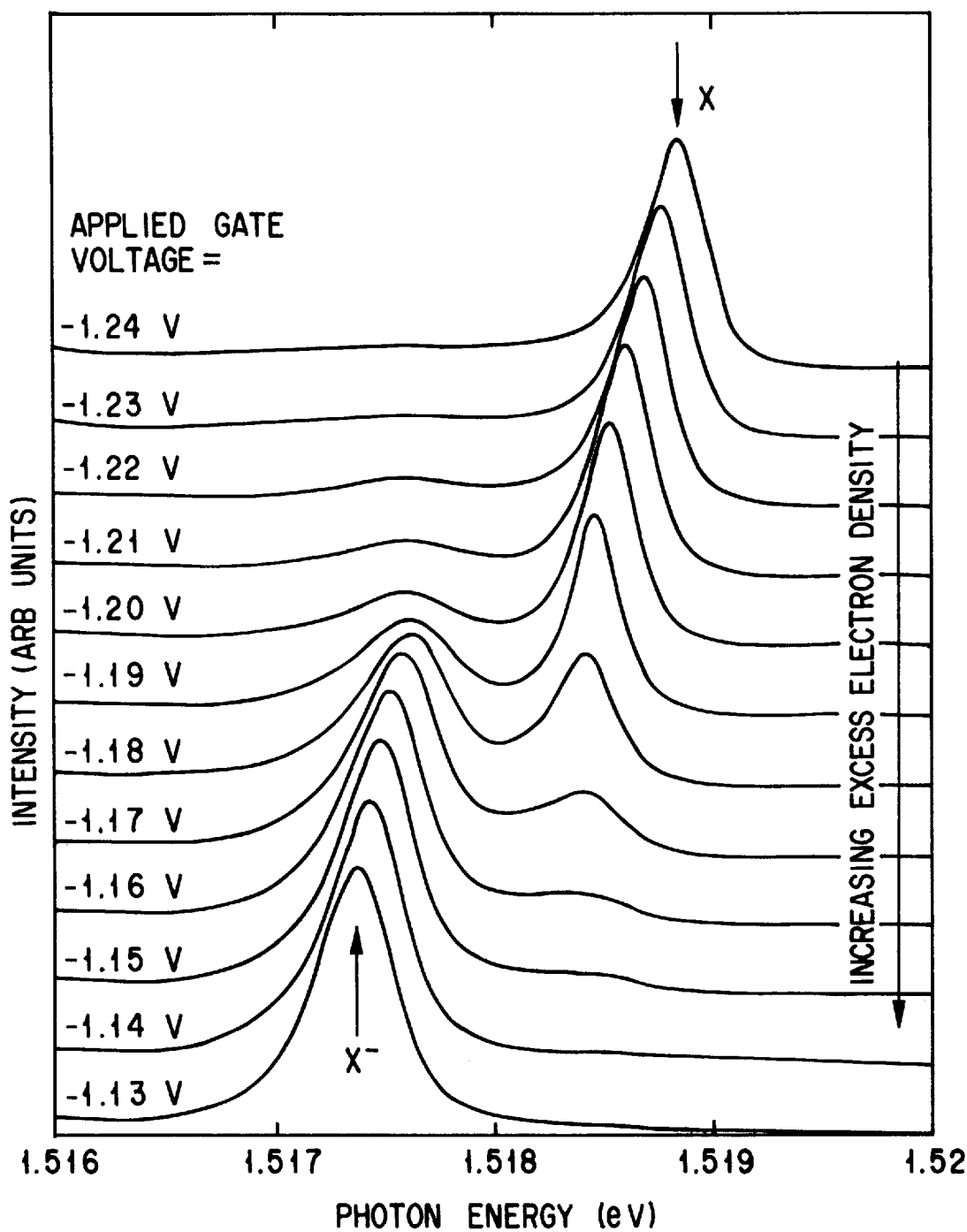
FIG. 7 shows photoluminescence spectra obtained using the device shown in FIGS. 5A to 6 at different gate bias voltages.

FIG. 7 plots photoluminescence spectra measured on this structure with different voltages applied to the gate relative to the source drain contacts which are held at the same potential. The spectra are offset vertically for clarity. The measurements were taken with the incident and emitted light propagating almost normal to the layers. This is purely for investigative purposes. Operation as a modulator would require a waveguide structure to be incorporated and the incident beam to be directed as in the first embodiment. The incident light was at an energy below the bandgap of the Al$_{0.33}$Ga$_{0.67}$As barriers. Evidence for the formation of negatively-charged excitons and enhancement of the optical transition strength below the energy of the zero-electron density bandedge exciton can be deduced from FIG. 7.

It can be seen in FIG. 7 that at the lowest gate bias (i.e., −1.24 V), corresponding to the smallest excess electron density in the quantum well, the spectrum is dominated by a single peak due to the neutral exciton (marked X in FIG. 7). As the gate bias is increased, so filling the quantum well with excess electrons, the neutral exciton line declines in intensity, while concurrently a transition to distinctly lower transition energy, due to the negatively-charge exciton (X$^-$), is seen to strengthen and eventually dominate the spectrum (at −1.13 V).

The method of the first aspect of the present invention is designed to operate near the photon energy of the negatively-charged exciton seen at larger gate biases.

The spectra in FIG. 7 demonstrate that increasing the excess electron density in the quantum well causes a quenching of the absorption strength of the bandedge neutral exciton, with concurrent strengthening of the negatively charged exciton to lower photon energy. Furthermore, electroreflectance spectra recorded on the sample showed a qualitatively similar behavior for the neutral and negatively-charged excitons with increasing excess electron density.

The first aspect of the present invention provides operation near the photon energy of the negatively-charged exciton seen at larger gate biases. It is apparent from FIG. 7 that there is a shift of the peaks due to the neutral and negatively-charged exciton to lower energy with increasing electron density. This shift is beneficial as it will tend to enhance the contrast between the absorption in the opaque and transparent states.

Figure 10:
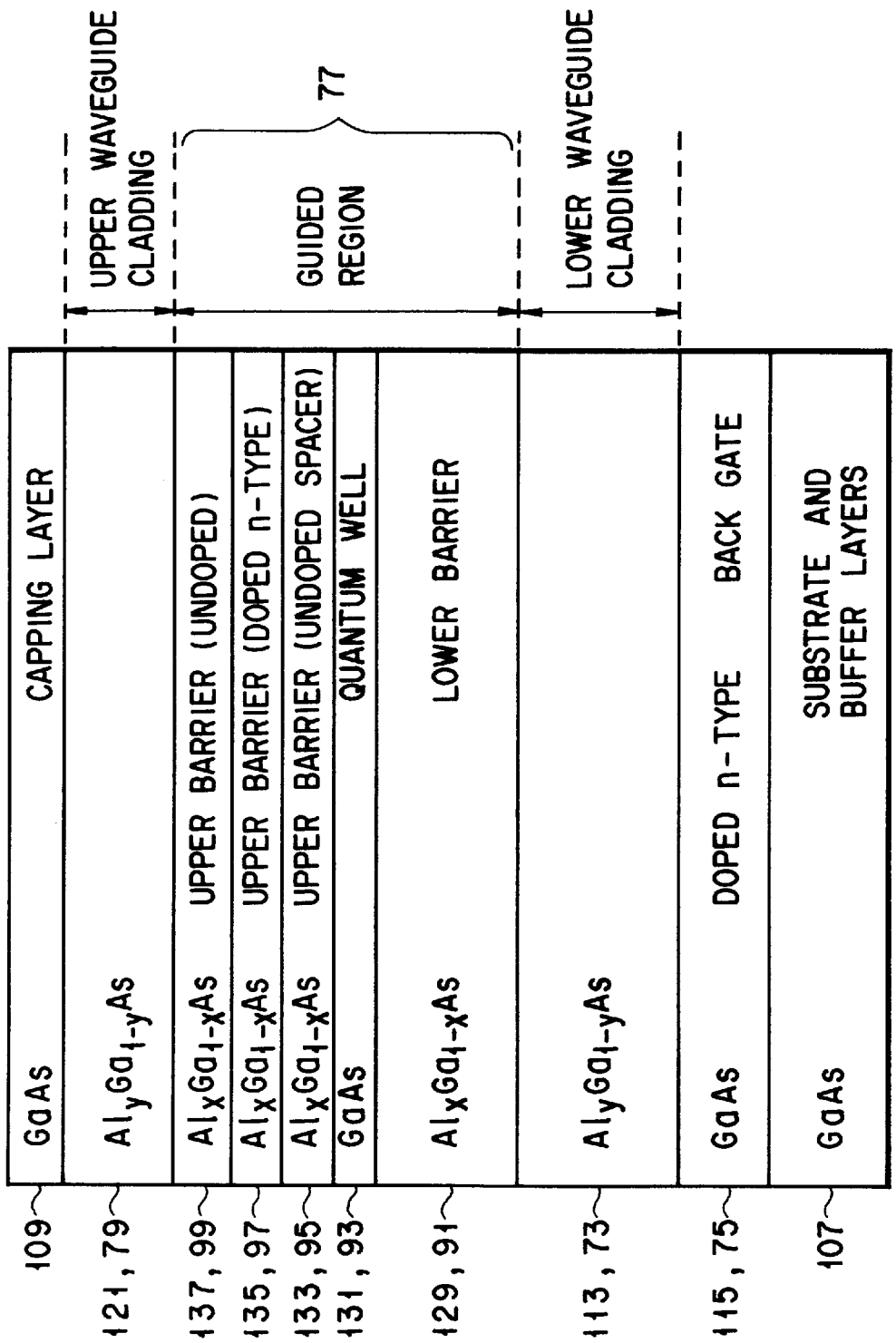
FIG. 10 shows details of the layer structure of the modulator shown in FIGS. 8 and 9 and also of the fourth embodiment of the modulator shown in FIGS. 11 and 12.

Turning now to FIGS. 8 to 10, there are shown structural details of one embodiment of a new form of optical modulator 71 in accordance with the second aspect of the present invention. This device comprises a lower cladding layer 73 (FIG. 8) formed above a back gate layer 75. The back gate 75 and lower cladding layer 73 are about from 0.1 to 1.0 μm and 0.3 to 1.0 μm thick, respectively. The back gate 75 is either n-type or p-type doped to an impurity concentration of about 10$^{18}$cm$^{-3}$ and is formed of GaAs or Al$_w$Ga$_{(1-w)}$As.

It will be seen that the basic structure is otherwise very similar to that of the device shown in FIGS. 2 to 4, although the Schottky gate 13 of that structure is omitted (but optionally, it could still be included in the device of FIGS. 8 to 10). The layer thicknesses are otherwise the same as or similar to those of the device shown in FIGS. 2 to 4.

Above the lower cladding layer 73 is formed an optical guide region 77 and above the latter is formed an upper cladding layer 79. The upper cladding layer 79 is selectively etched to produce a raised ridge 81 to complete the waveguide structure defining the optical path 83 for an incident light beam 85, directly below the ridge 81.

On either side of the ridge 81 are respectively formed a source ohmic contact 87 and a drain ohmic contact 89 which penetrate the upper cladding layer 79 to permit electrical contact with the quantum well in the guide region 77.

The layer structure of the guide region 77 is shown in FIG. 9. It comprises a lower undoped barrier layer 91 below a quantum well or active layer 93. A middle undoped barrier or spacer layer 95 is situated above the quantum well layer 93. A doped (p-type or n-type) barrier layer 97 is formed over the middle barrier layer 95 and an upper undoped barrier layer 99 is situated above the doped barrier layer 97. The middle barrier layer 95 and upper undoped barrier layer 99 are optional.

Electrical contact is made to the back gate 75 by an ohmic contact 101 having a contact pad 103 located in a recess 105 through the upper cladding layer 79 and guide region 77. Recessing of the gate contact 101 avoids making a short to the quantum well layer 93 in the guide region 77. This is done by etching a hole through a lithographically defined mask in the surface to a depth just below the quantum well layer 93. A suitable metal is then deposited on a region, through another smaller lithographically defined mask, inside the etched region and annealed to form the ohmic contact to the back gate 75. For the case a GaAs n-type back gate, a suitable back gate ohmic metal is Ni—Au—Ge.

For the shallow source and drain ohmic contacts 87, 89, it is important that they do not spike into the back gate 75 itself and thus short the device. For an electron gas within the quantum well, for instance, shallow ohmic contacts are formed by deposition of Ge—Au and subsequent annealing. Shallow ohmic contacts can also be formed by deposition and annealing of Pd—Ge, after recessing the contact to within 100 Å of the quantum well layer. An alternative method of making ohmic contacts to the quantum well, while avoiding making contact to the back gate, is described in Linfield et al, J. Vac. Sci. and Tech. B 12, 1290 (1994).

FIG. 10 shows the full layer arrangement of the structure shown in FIG. 8, including details of the guide region 77 shown in FIG. 9. The structure is formed on a substrate/buffer layer structure 107 and completed with an upper cap layer 109. The composition and thickness of each layer shown in FIG. 10 is listed in Table 3 hereinbelow.

TABLE 3

STRUCTURE OF DEVICE SHOWN IN FIG. 10

| LAYER | MATERIAL | THICKNESS | IMPURITY CONC(cm$^{-3}$) |
|---|---|---|---|
| Capping layer 109 | GaAs | 10 nm | — |
| Upper cladding layer 79 (121) | Al$_y$Ga$_{1-y}$As | 0.5 μm | — |
| Upper barrier layer 99 (137) | Al$_x$Ga$_{1-x}$As | 40 nm | — |
| Doped barrier layer 97 (135) | Al$_x$Ga$_{1-x}$As | 0.2 μm | 1 × 10$^{17}$ |
| Middle barrier (spacer) layer 95(133) | Al$_x$Ga$_{1-x}$As | 60 nm | — |
| Quantum well layer 93 (131) | GaAS | 20 nm | — |
| Lower barrier layer 91 (129) | Al$_x$Ga$_{1-x}$AS | 0.3 μm | — |
| Lower cladding layer 73 (113) | Al$_x$Ga$_{1-y}$As | 0.5 μm | — |
| Back gate 75(115) | GaAs | 0.3 μm | 1 × 10$^{18}$ |
| Buffer 107 | GaAs | 1 μm | — |
| Substrate 107 | GaAs | unspec. | — |

In Table 3, x = 0.3; y = 0.5

The carrier density within the quantum well layer 93 is controlled by applying a voltage between the back gate 75 and the drain ohmic contact 89. Hence, the back gate 75 is used to vary the carrier density in the quantum well layer in a similar manner to the front gate 13 in the device of FIGS. 2 to 4.

For this structure, all of the quantum well can be depleted of carriers, unlike the structure in FIGS. 2 to 4, where only the region under the stripe is depleted. This is advantageous if the device is operated at photon energy A (see FIG. 1), since the areas of the quantum well adjacent to the stripe in FIG. 2, which are not depleted, will absorb a small fraction of the light when the device is in the transparent state. This absorption in the transparent state constitutes loss and is undesirable.

FIGS. 11 and 12 show structural details of another embodiment of the new form of optical modulator in accordance with the second aspect of the present invention. In this device, the overall layer structure is the same as shown in FIG. 10 and tabulated in Table 3. Therefore, the reference numerals used in FIGS. 11 and 12 are shown bracketed in FIG. 10 and Table 3.

This device 111, comprises a lower cladding layer 113 (FIG. 11) formed above a back gate layer 115. These layers have the same thickness as the corresponding layers in the embodiment of FIGS. 8 to 10. Again, the back gate 115 can either be n-type or p-type doped and formed of GaAs or Al$_w$Ga$_{(1-w)}$As.

This device differs from that in the embodiment of FIGS. 8 to 10 in that shallow source and drain ohmic contacts are not employed but instead, a front gate 117 is employed, similar to that in the device shown in FIGS. 2 to 4.

Above the lower cladding layer 113 is formed an optical guide region 119 and above the latter is formed an upper cladding layer 121. The front gate 117 is formed as a Schottky metal gate on top of a ridge 123. However, in this case, the etching to produce the ridge is taken through the upper cladding layer 121, part-way into the guided region 119, so as to deplete the region of the quantum well outside the ridge. Alternatively the etch can be terminated in the upper cladding layer, so as to leave carriers in the regions of the quantum well outside the ridge. Again, the upper ridge 123 defines the optical path 125 for an incident light beam 127, directly therebelow.

The layer structure of the guide region 119 is shown in FIG. 12. It comprises a lower undoped barrier layer 129, above the lower cladding layer 113. Above the lower barrier layer 129 is formed a quantum well or active layer 131. A middle undoped barrier spacer layer 133 is situated above the quantum well layer 131. A doped (p-type or n-type) barrier layer 135 is formed over the middle barrier layer 133. An upper undoped barrier layer 137 is situated above the doped barrier layer 135 and above this is formed the upper cladding layer 121. Again, the middle barrier layer 133 and upper undoped barrier layer 137 are optional. It will be seen from FIG. 12 that the etch to produce the ridge 123 is taken down through the upper cladding layer 121, the upper barrier layer 137 and the doped barrier layer 135, part way down into the middle barrier layer 133 so that the doped barrier layer 135 and upper barrier layer 137 are completely included in the ridge 123.

As with the device of FIGS. 8 to 10, electrical contact is made to the back gate 115 by an ohmic contact 139 having a contact pad 141 located in a recess 143 through the guided region 119. This is formed in the same way as for the back gate contact in the embodiment of FIGS. 8 to 10.

With the device operating at photon energy A (of the charged exciton) in FIG. 1, the waveguide is essentially transparent when the voltage between the front and back gate is chosen so that there are no (or very few) excess electrons in the well. At this photon energy A, the absorption is small.

By changing the voltage applied between the front and back gates excess electrons are induced in the area of the well underneath the ridge. This increases the absorption at photon energy A thus turning the device into its opaque state.

The device can also be operated at photon energy B, whereby it is opaque with no excess electrons in the well and more transparent when excess electrons are added to the well.

Figure 15:
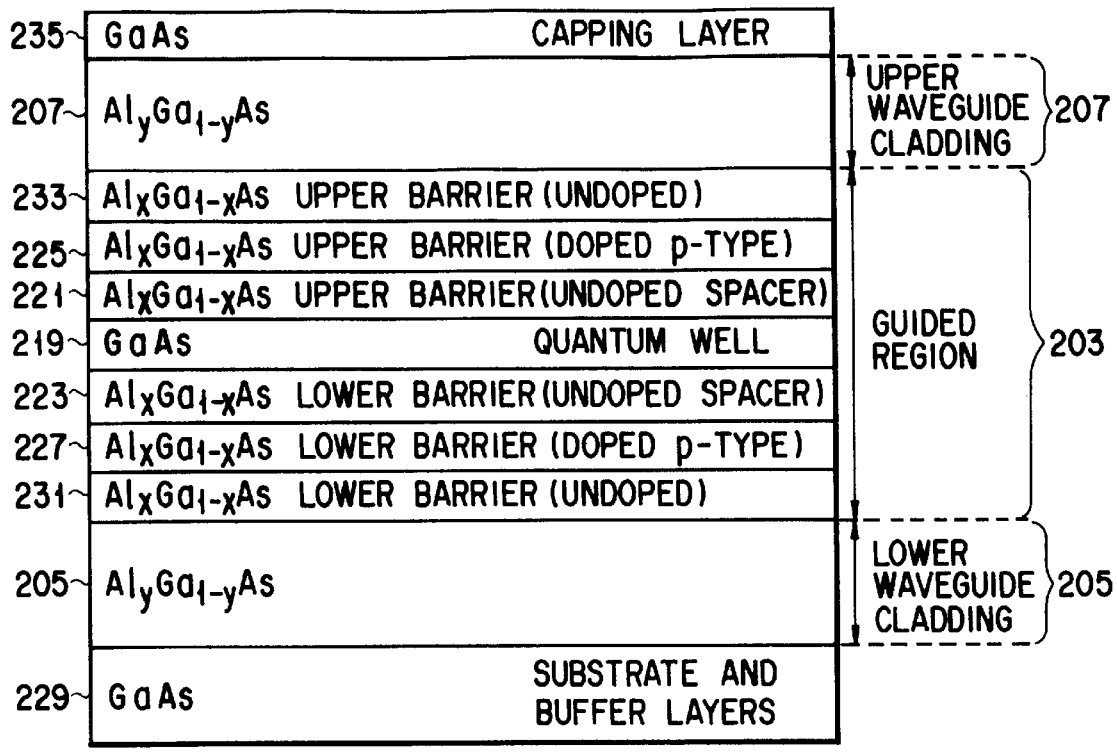
FIG. 15 shows details of the complete layer structure of the device shown in FIGS. 13 and 14.

The structure of a fifth embodiment of an optically activated optical modulator according to the third aspect of the present invention is shown in FIGS. 13 to 15. The optical modulator 201 comprises a waveguide region 203 situated between a lower cladding layer 205 and an upper cladding layer 207. This waveguide region 203 constitutes a "modulation region" in the terminology of the claims. The upper cladding layer is etched to form a ridge 209 which functions as a strip waveguide defining an optical path 211 therebelow, in the waveguide region 203. A beam 213 to be modulated is transmitted through the optical path 211. Modulation is effected by means of an applied incident control beam 215 used to irradiate the top of the device, and in particular, the top surface 217 of the ridge 209. Optionally the area of the device outside of the ridge can be covered with a suitable material opaque to the control light, so as to prevent penetration of the control beam in these regions.

Details of the waveguide region 203 are shown in more detail in FIG. 14. It comprises a quantum well layer 219 situated between an upper undoped spacer layer 221 and a lower undoped spacer layer 223. An upper doped barrier layer 225 is situated above the upper spacer layer 221. A lower doped barrier layer 227 is situated below the lower spacer layer 223. Optionally a lower undoped barrier layer 231 is formed below the lower doped barrier layer 227 and an upper undoped barrier layer 233 is formed above the upper doped barrier layer 225. The upper spacer, upper doped barrier and upper undoped barrier layers 221, 225, 223 constitute an "upper barrier region" 226 and the lower spacer, lower doped barrier and lower undoped barrier layers 223, 227, 231 constitute a "lower barrier region" 228.

In use, the control beam 215 is chosen to have a photon energy larger than the bandgap of the material of the barrier layers 225, 227 to the quantum well 219. The waveguided beam 213 has a lower photon energy around the bandgap of the well material.

Details of the complete layer structure, in order of growth, can be seen in FIG. 15;

1 μm GaAs buffer layer 229;
1 μm $Al_{0.5}Ga_{0.5}As$ waveguide cladding 205;
100 nm $Al_{0.33}Ga_{0.67}As$ lower barrier 231;
100 nm $Al_{0.33}Ga_{0.67}As$ lower barrier (p-type $5\times10^{17}$ cm$^{-3}$) 227;
100 nm $Al_{0.33}Ga_{0.67}As$ lower barrier (undoped spacer) 223;
20 nm GaAs quantum well layer 219;
100 nm $Al_{0.33}Ga_{0.67}As$ upper barrier (undoped spacer) 221;
100 nm $Al_{0.33}Ga_{0.67}As$ upper barrier (p-type $5\times10^{17}$ cm$^{-3}$) 225;
100 nm $Al_{0.33}Ga_{0.67}As$ upper barrier 233;
1 μm $Al_{0.5}Ga_{0.5}As$ waveguide cladding 207;
10 nm GaAs cap 235.

The ridge 209 is 1 to 5 μm wide.

Figure 16:
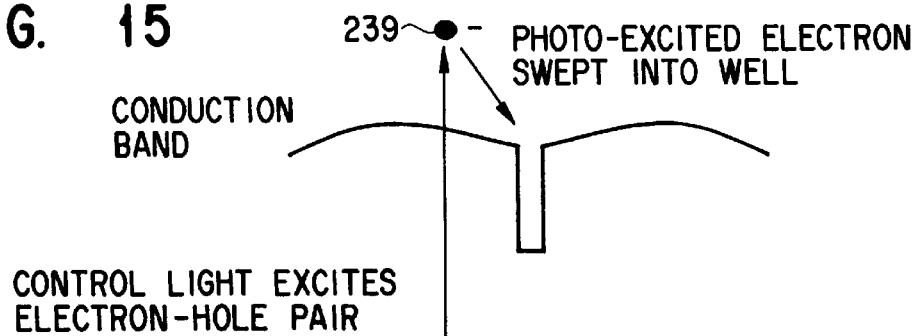
FIG. 16 shows the conduction and valence band profiles for the quantum well/barrier layer structure for explaining operation of the device shown in FIGS. 13 to 15 and also the device shown in FIGS. 22 and 23.
Figure 16:
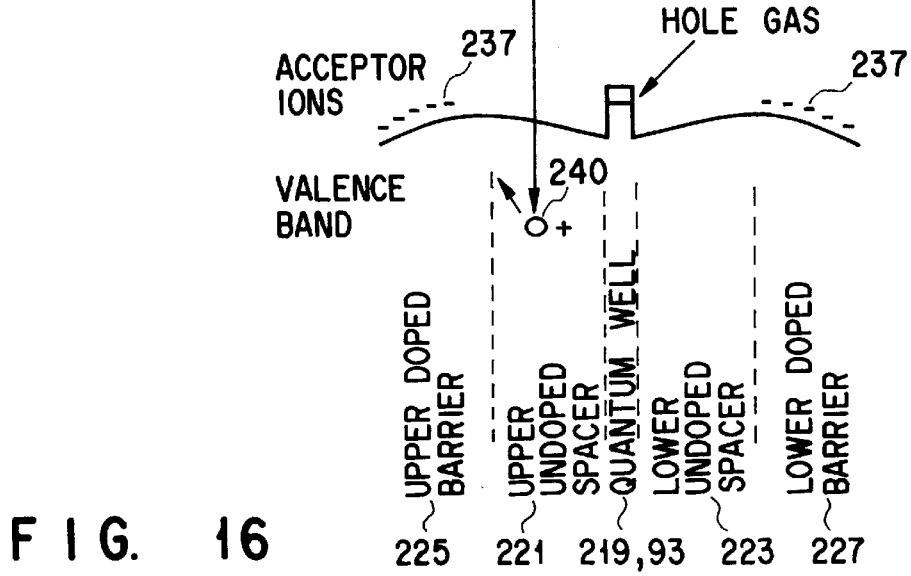

FIG. 16 explains how the control beam 215 is used to vary the excess carrier density in the quantum well layer 219 and thereby change the absorption of the waveguided beam. The energy of the control beam 215 is chosen to have an energy greater than the bandgap of the barrier material, but smaller than that of the waveguide cladding 205. Hence most of control light is absorbed in the relatively thick barrier layers above and below the quantum well.

FIG. 16 shows how the internal electric field produced by the ionized acceptors 237 in the barriers tends to spatially separate the photo-excited electrons 239 and holes 240. Electrons photo-excited in the spacer regions 221, 223 in the barrier either side of the well 219 are swept by the internal electric field into the quantum well 219, where they recombine with the excess holes, thereby lowering their density. On the other hand, the photo-excited holes are swept toward the maxima of the valence band, as shown in FIG. 16. Some of these photo-excited holes recombine with ionized acceptors. The effect of the control light, therefore, is to reduce the excess hole density in the quantum well. Since the absorption of the quantum well (at energies around the quantum well bandgap) is very sensitive to the excess hole density, the transmission of the waveguided beam can be controlled and switched between high and low values.

Although FIG. 16 illustrates operation of the device with p-type doped layers near the quantum well, clearly n-type layers could also be used. In this case holes photo-excited in the barrier regions are swept into the quantum well, where they recombine with, and lower the density of, the excess electrons. Our investigations have shown the structure with p-type doped layers near the well is more sensitive to the incident light.

The device of FIGS. 13 to 15 has a p-type remotely doped quantum well, although this principle can also be applied to a n-type remotely doped well. However, it has been found that the depletion of the quantum well can be achieved for lower intensities of the control light beam for the case of a p-type remotely-doped quantum well. This may be due to photo-excited electrons being more efficiently swept into the well for remote p-type doping, than photo-excited holes for n-type structures.

Although layers 225 and 227 of the upper barrier region 226 and lower barrier region 228 have been doped for the device shown in FIGS. 13 to 15, the device will also operate if only the upper barrier layer 225 is doped. In that case, operation relies upon most of the light being absorbed by the upper barrier. However, the double-sided doping arrangement is preferred, since this will be more sensitive to the control light.

The device could also be made with a stack of several quantum wells each remotely doped in its upper and lower barrier regions.

The excess hole density in the quantum well layer 219 is varied with the control optical beam 215, rather than an electrical voltage as with some conventional modulators. Consequently gate and ohmic contacts are not required for this device but can be optionally included. The ridge 209 can be etched to a depth within either the upper cladding layer 207 as shown in FIG. 13, or the waveguiding layer 203. For the latter, the ridge 209 is etched to the depth of the dopant atoms, so that there are no excess carriers in the area of the quantum well layer 219, outside the ridge 209. This has the advantage of reducing absorption losses due to absorption outside the ridge in the transparent state when operating at a relatively lower photon energy A in FIG. 1, corresponding to a charged exciton. When operating at a relatively higher photon energy B, corresponding to a neutral exciton (FIG. 1) it may be better to etch only as far as the upper waveguide layer.

The control beam 215 should preferably impinge uniformly on the whole of the upper surface 217 of the ridge so as to achieve uniform depletion of the quantum well layer 219. The intensity of the control beam 215 should be switched between two finite values which achieve maximum change in the absorption of the waveguided beam 213. Alternatively, the spacer layer thicknesses, dopant concentrations, etc., can be chosen so that either the optimal transparent of opaque state is achieved with no light incident on the structure. This allows the intensity of the control light to be varied between zero and a finite value to achieve maximum modulation of the waveguided beam 213.

Figure 17:
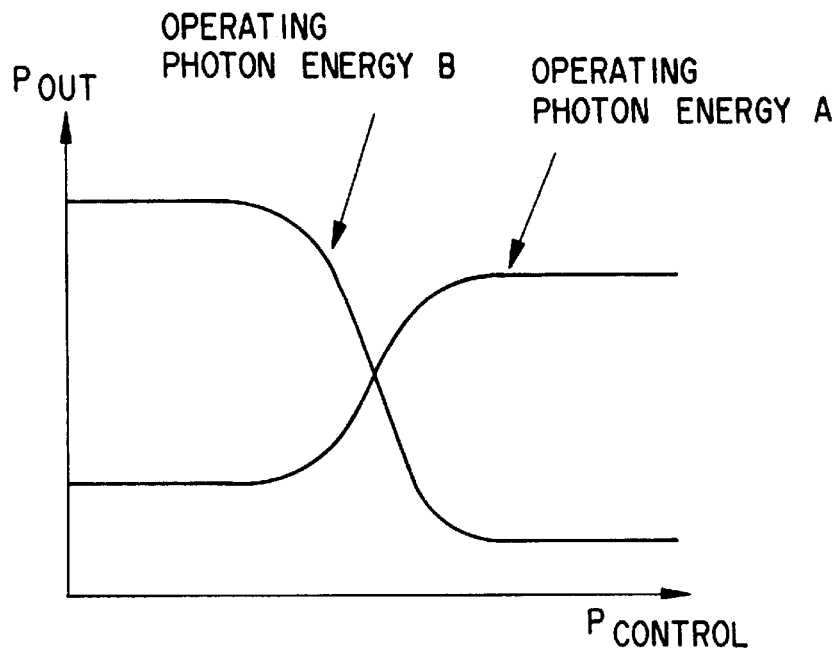
FIG. 17 shows operation in neutral and charged exciton modes for the device shown in FIGS. 13 to 15.

FIG. 17 shows a schematic of the variation in the intensity of the beam transmitted through the waveguide ($P_{out}$) as a function of the intensity of the control beam ($P_{control}$) When intensity of the control beam is low the excess carrier density in the well is relatively large and hence the absorption profile resembles the dashed line shown in FIG. 1. The absorption at photon energy A is relatively large and that at photon energy B is relatively small.

As the intensity of the control beam increases, the excess carrier density in the quantum well decreases, as discussed above. For some control beam intensity the excess carrier density is minimal and the absorption profile then resembles the solid line in FIG. 1. The absorption at photon energy A is reduced, while that at photon energy B is increased. Hence, increasing the control beam intensity has the effect of increasing the transmission of the waveguide at photon energy A, while decreasing its transmission at photon energy B, as shown schematically in FIG. 17.

Thus, the intensity of the control beam can be varied so as to switch the transmission of the waveguide at either photon energy A or photon energy B.

Figure 18:
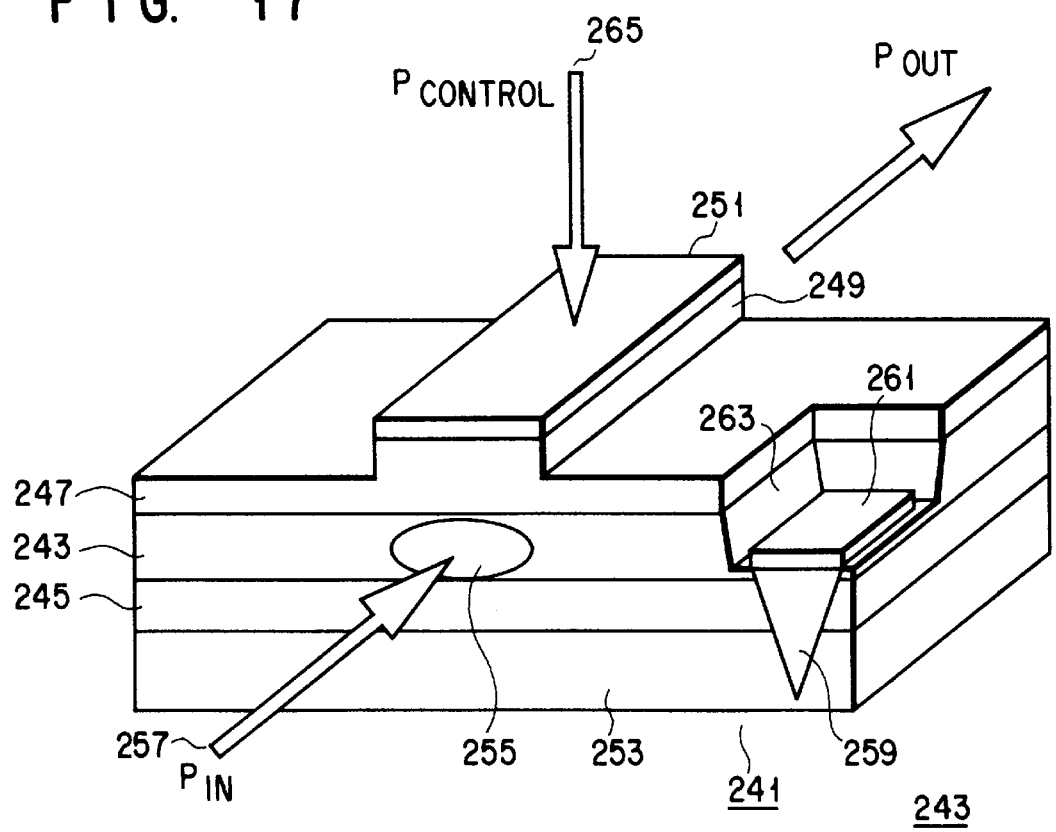
FIG. 18 shows a sectional perspective view of a sixth embodiment of an optically activated optical modulator according to the third aspect of the present invention.
Figure 19:
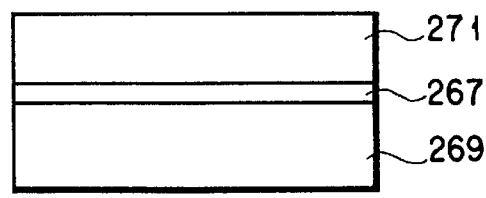
FIG. 19 shows details of the waveguide region of the device shown in FIG. 18.
Figure 20:
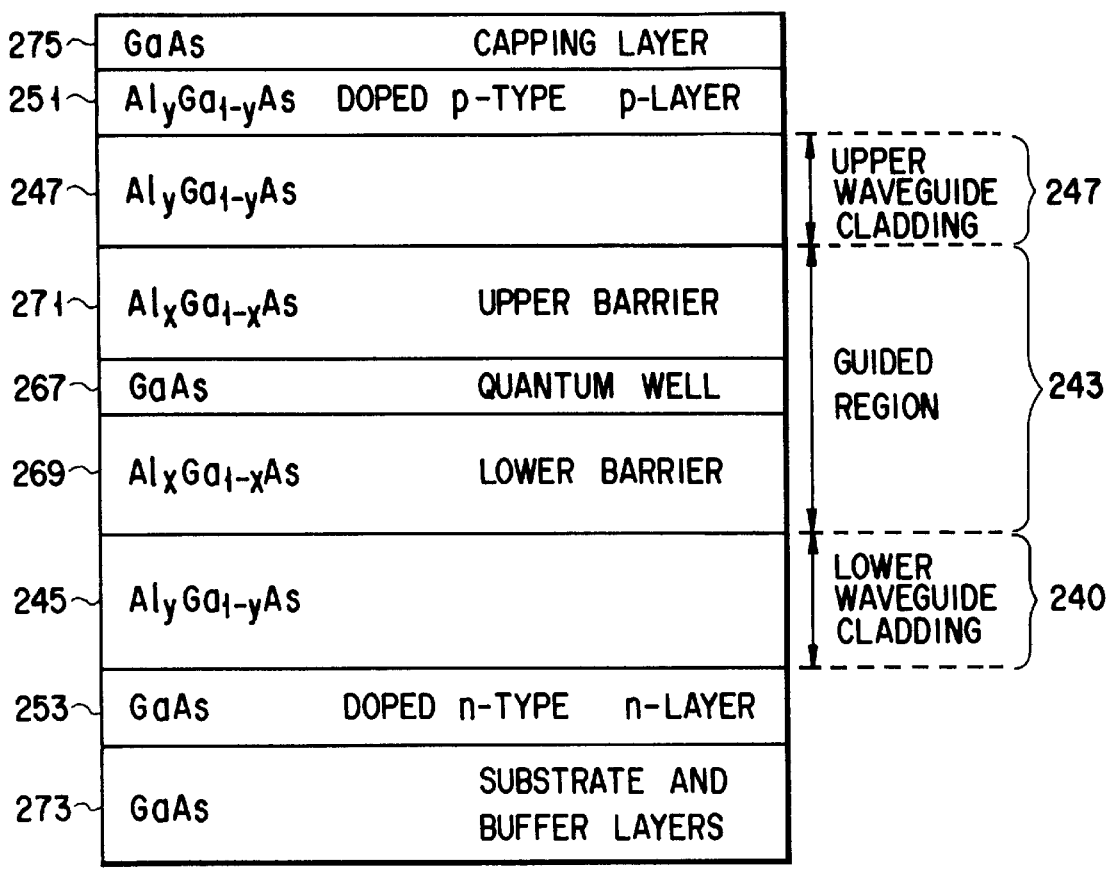
FIG. 20 shows details of the complete layer structure of the device shown in FIGS. 18 and 19.

A sixth embodiment of an optically activated optical modulator according to the third aspect of the present invention is shown in FIGS. 18 to 20. Like with the fifth embodiment a control optical beam is used to switch the transmission of a second beam propagating through the waveguide between low and high values. The modulator of the sixth embodiment operates in a similar manner to the fifth embodiment, except that the photo-excited electrons (or holes) increase the excess carrier density in the quantum well, rather than decrease it as with the fifth embodiment.

Referring now to FIGS. 18 and 19, there is shown an optical modulator 241, comprising a waveguide region 243 disposed between a lower cladding layer 245 and an upper cladding layer 247. The upper cladding layer 247 is etched to form a ridge 249 on which is formed a p-type doped layer 251. An n-type doped layer 253 is formed below the lower cladding layer 245. The ridge 249 defines an optical path 255 thereunder, through the waveguide region 243, for transmitting a beam 257.

Optionally, electrical contacts can be provided to the p-type layer 251 and n-type layer 253. In the case of the latter, this is preferably affected by means of an ohmic contact 259 with a contact pad 261, disposed in a recess 263 through the waveguide region 243 and upper cladding layer 247. The ohmic contact to the lower doped region can also be made to the back face of the substrate, if the lower doped region is grown on similarly doped buffer and substrate layers.

The transmitted beam 257 is modulated by means of an applied control beam 265 which is used to irradiate the upper surface of the p-type layer 251 on top of the ridge 249.

Details of the waveguide region 243 are shown in FIG. 19. It comprises a quantum well layer 267, disposed between a lower undoped barrier layer 269 and an upper undoped barrier layer 271. Details of the complete layer structure of this device are shown in FIG. 20. In order of growth, these are as follow:

1 $\mu$m GaAs buffer and substrate layers 273;
1 $\mu$m GaAs back gate (doped n-type $10^{18}$ cm$^{-3}$) 253;
0.5 $\mu$m Al$_{0.5}$Ga$_{0.5}$As waveguide cladding layer 245;
300 nm Al$_{0.33}$Ga$_{0.67}$As lower barrier layer (undoped) 269;
20 nm GaAs quantum well layer 267;
300 nm Al$_{0.33}$Ga$_{0.67}$As upper barrier (undoped) layer 271;
0.3 $\mu$m Al$_{0.5}$Ga$_{0.5}$As waveguide cladding layer 247;
0.2 $\mu$m Al$_{0.5}$Ga$_{0.5}$As waveguide cladding (doped p-type $10^{18}$ cm$^{-3}$) layer 251;
10 nm GaAs cap layer 275.

The ridge 249 is 1 to 5 $\mu$m wide and etched to leave 0.2 $\mu$m of the upper waveguide cladding layer. The back gate could also be n-type Al$_{0.5}$Ga$_{0.5}$As so as to produce extra optical confinement. The upper cladding layer could also be made from a dielectric material with a refractive index smaller than that of the Al$_{0.33}$Ga$_{0.67}$As guided region and be transparent to the control beam. Optionally the area of the device outside of the ridge can be covered with a suitable material opaque to the control light, so as to prevent penetration of the control beam in these regions.

Doped n-type 253 and p-type 251 regions are arranged relatively far from either side of the quantum well layer 267, as shown in FIG. 18, so that there is an (approximately) uniform electric field across the guided region 243. As mentioned above, optionally, ohmic contacts can be made to the n-type and p-type regions 251, 253 and a voltage applied between them so as to increase this electric field and thus enhance the switching speed of the device.

The upper doped region 251 can be replaced with a semi-transparent Au layer, which will act as a Schottky contact, while retaining the lower doped region 253. The layer should be sufficiently thin to allow transmission of a significant fraction of the control light. The Schottky contact will develop an electric field across the guided region in a similar manner to the p-i-n structure. Again electrical contacts can be made to the Schottky layer and doped lower region 253, so that a voltage can be applied between them in order to enhance the electric field across the guided region.

The control beam 265 is chosen to have a photon energy larger than the bandgap of the material of the barrier layers 269, 271 but smaller than that of the waveguide cladding layers 245, 247. Its photo energy is chosen to be sufficiently large so that most of the control beam energy is absorbed in the upper barrier region 271, creating photo-excited electron-hole pairs. The electric field across the guided region separates these photo-excited carriers, with the electrons being accelerated in one direction and the holes in the other. For the arrangement of p-type and n-type layers shown in FIG. 18, electrons photo-excited in the upper barrier are swept into the quantum well, while the holes are swept toward the p-type layer. This can be seen from FIG. 21, which shows the spatial variation of the conduction 277 and valence 279 band edges within the guided region 243. Electrons 281 which are photo-excited in the upper barrier layer 271 are swept into the quantum well 267 by the gradient. Photo-excited holes 283 are swept towards the front of the device.

Hence, the control light beam 265 causes an increase in the excess electron density within the quantum well 267 and thereby modifies its bandedge absorption spectrum. This change in the bandedge absorption profile of the quantum well 267 is used to switch the transmission of the second optical beam 257 propagating through the waveguide with a photon energy close to the quantum well bandedge.

Figure 21:
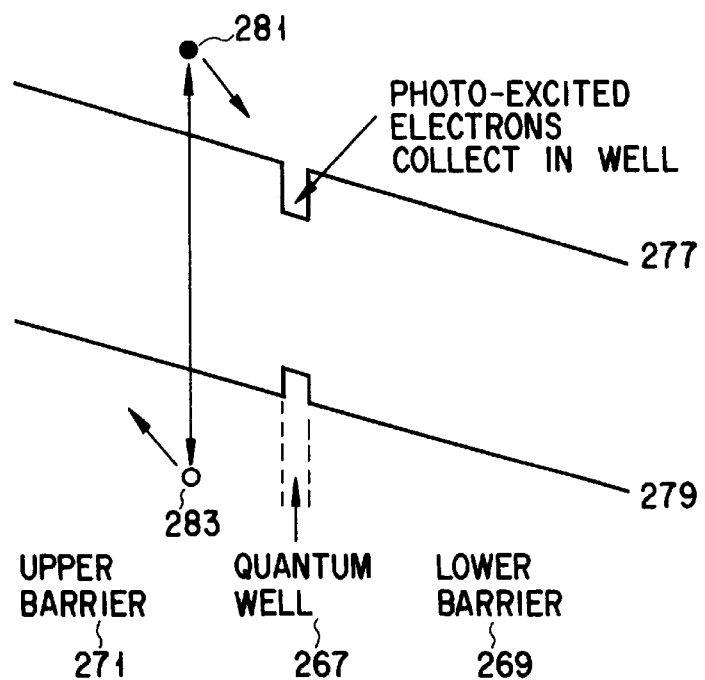
FIG. 21 shows the conduction and valence band profile for the quantum well/barrier layer structure for explaining operation of the device shown in FIGS. 19 and 20.

FIG. 18 shows the upper doped region being p-type and the lower one n-type, so that electrons photo-excited in the upper barrier 271 are swept into the quantum well 267 (FIG. 21). However, interchanging the positions of the n-type and p-type layers reverses the direction of the electric field, so that holes photoexcited in the upper barrier layer 271 are swept into the well 267. The former arrangement produces faster switching times, since the electrons are more efficiently collected by the electric field.

Figures 22, 23:
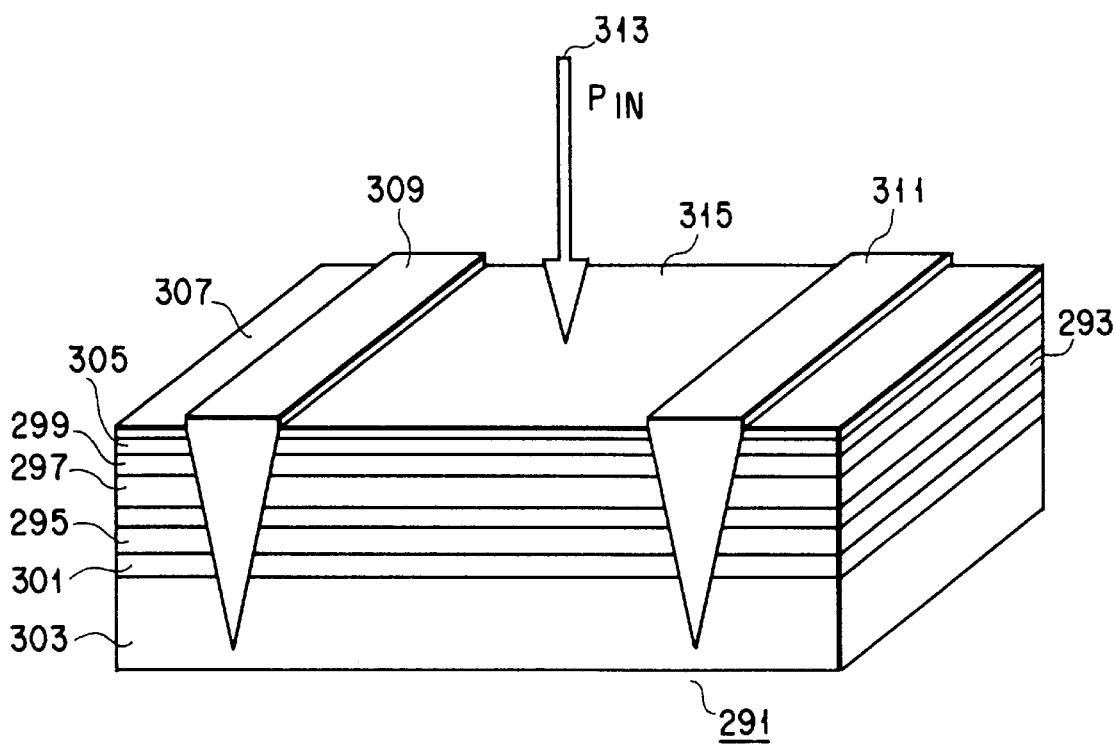
FIG. 22 shows a sectional perspective view of an embodiment of an optical detector according to the third aspect of the present invention.
FIG. 23 shows details of the complete layer structure of the device shown in FIG. 22.

An embodiment which is an optical detector 291 in accordance with the third aspect of the present invention, is shown in FIGS. 22 and 23. A quantum well layer 293 is disposed between an undoped lower spacer layer 295 and an upper undoped spacer layer 297. Above the upper undoped spacer layer 297 is disposed a doped upper barrier layer 299. A lower doped barrier layer 301 is disposed beneath the lower undoped spacer layer 295. Beneath the entire above-mentioned structure is situated a bottom undoped barrier layer 303 and above the aforementioned structure is a top undoped barrier layer 305, covered with a capping layer 307. A source ohmic contact 309 contacts the quantum well layer 293 and spaced apart therefrom, a drain ohmic contact 311 also contacts the quantum well layer. The device is operated by illumination with an incident light beam 313 which illuminates the upper surface 315 of the capping layer 307.

Details of the entire layer structure are shown in FIG. 23, in order of growth:

1 μm GaAs buffer layer and substrate 317;

0.5 μm $Al_{0.33}Ga_{0.67}As$ bottom barrier 303; 100 nm $Al_{0.33}Ga_{0.67}As$ lower barrier (doped $5\times10^{17}$ cm$^{-3}$) layer 301;

100 nm $Al_{0.33}Ga_{0.67}As$ lower barrier (undoped spacer) layer 295;

30 nm GaAs quantum well layer 293;

100 nm $Al_{0.33}Ga_{0.67}As$ upper barrier (undoped spacer) layer 297;

100 nm $Al_{0.33}Ga_{0.67}As$ upper barrier (doped $5\times10^{17}$ cm$^{-3}$) 299;

100 nm $Al_{0.33}Ga_{0.67}As$ top barrier (undoped) layer 305; and

170 Å GaAs cap layer 307.

These layers are etched to form a mesa of finite area, with the etch depth extending below the quantum well. The ohmic contacts 309, 311 to the quantum well layer 293 are formed on top of, and at opposite ends of, the mesa, using conventional methods.

Si can be used as a p-type dopant in GaAs/$Al_{0.33}Ga_{0.67}As$ heterostructures grown on a (311) oriented GaAs substrate. Alternatively, other p-type dopants are available on (100) oriented GaAs substrates, as known to those skilled in the art.

In use, a voltage is applied between the source and drain ohmic contacts 309, 311, causing a current (I) to flow through the quantum well layer 293 containing excess carriers. The light beam 313 incident on the structure, of intensity Pin, which has a photon energy larger than the bandgap of the barrier layers 303, 301, 295, 297, 299, 305 in the structure, causes a decrease in the excess carrier density in the quantum well layer 295, hence an increase in its resistance and a decrease in the current between the source and the drain, as shown in FIG. 24. Hence, the level of light incident on the top surface 315 of the structure can be determined from the measured current.

Optionally the structure can be doped solely in its upper barrier region 299. However, it is desirable to remotely dope the quantum well region in both the upper and lower barrier regions 299, 301, since in this case the device will also be sensitive to photons absorbed in the lower barrier region 301. For the asymmetrically-doped GaAs/$Al_{0.33}Ga_{0.67}As$ heterostructure, the undoped lower $Al_{0.33}Ga_{0.67}As$ barrier can be replaced by a superlattice of alternating layers of GaAs and $Al_{0.33}Ga_{0.67}As$ layers, each with a thicknesses of 2.5 nm (for example). This should improve the quality of the quantum well layer.

Optionally the lower barrier and its dopants can be omitted altogether. In this case the layer structure consists of a thick (e.g., 2 micron) GaAs layer, followed by the upper barrier layers 297, 299, 305 and capping layer 307 shown in FIG. 23.

Several quantum wells may also be arranged on top of one another separated by barriers, a central portion of each barrier being doped.

The area around the source and drain ohmic contacts 309, 311 can optionally be covered by an opaque material using standard techniques. This has the advantage of preventing the light from effecting the operation of the contacts and, secondly, breaks the path for parallel conduction between the source and drain by photo-excited carriers in the barriers.

The current can be determined by means of an integrated or external circuit (not shown). For instance, the voltage can be measured across a resistor placed in series with the device and the voltage source.

The light to be detected should have a photon energy larger than the bandgap of the barrier material. The device relies upon the internal electric fields of the structure disassociating electron-hole pairs photo-excited in the barrier regions. The electric field is such that the photo-excited carriers of opposite sign to the majority carriers in the well are swept into the well, thereby reducing the excess carrier density in the well and increasing its resistance.

A semi-transparent Schottky gate could optionally be added to the top of the structure, and a voltage applied between it and the drain ohmic contact 311, so as to alter or enhance the electric field in the upper barrier region. Similarly, the structure could be grown on a doped region to form a back gate, and a voltage applied between the drain and an ohmic contact to this back gate, so as to modify and enhance the electric field in the lower barrier region.

The structure of FIGS. 22 and 23 uses electric means to detect the light intensity, however, this could also be achieved with a second optical beam. For this purpose, the structure could be arranged within a waveguide structure, as in the device of FIGS. 13 and 14.

In FIGS. 25 to 27, there is shown a bistable optical element according to the seventh embodiment of the present invention. This device 401 comprises an optical path region (layer) or "guide region" 403, disposed between a lower cladding layer 405 and an upper cladding layer 407 which has been selectively etched to form a waveguide ridge 409. The ridge 409 functions as a strip waveguide under which is thereby defined, an optical path 408 for a transmitted light beam 410.

As seen in more detail in FIG. 26, the optical path region comprises a plurality of quantum well layers 411, etc., interspersed with respective barrier layers 413, etc. The quantum well layers have a forbidden optical bandgap smaller than that of the barrier layers.

The complete layer structure, including the lower and upper cladding layers 405, 407 and guided region 403 is shown in FIG. 27. In order of growth, on a GaAs substrate/buffer layer structure 415 is formed the lower cladding layer 405 of 1.0 μm $Al_{0.5}Ga_{0.5}As$. The guided region 403 is formed on the latter with alternating quantum well layers 411 of GaAs (150 Å) dispersed with barrier layers 413 of $Al_{0.33}Ga_{0.67}As$ (100 Å).

The upper waveguide cladding layer 407 consists of 0.5 μm $Al_{0.5}Ga_{0.5}As$ which is etched to form a 5 μm wide ridge which is 0.2 μm deep. The etch also penetrates the 100 Å GaAs capping layer 417 which is the final epilayer.

FIGS. 28 and 29 show schematically, the intensity of the light beam 410 (see FIG. 25) transmitted by the structure ($P_{out}$) as a function of the intensity of the incident beam ($P_{in}$), for two different photon energies. For FIG. 28, the photon energy is chosen to be close to that of the charged excitons of the quantum well, i.e., operating photon energy A in FIG. 1. For FIG. 29, the photon energy is chosen close to that of the neutral exciton, i.e., operating photon energy B in FIG. 1.

Considering, firstly, FIG. 28, (where the photon energy lies close to that of the charged excitons), at low incident powers (point a in FIG. 28), the absorption of the quantum well is relatively small at photon energy A, since the well contains relatively few excess carriers and its absorption profile therefore resembles the solid line in FIG. 1. As the light intensity is increased, the density of photons absorbed in the well, and hence the density of photo-excited electrons and holes increases. These photo-excited electrons and holes form a background density of carriers. Eventually, this background carrier density becomes sufficient to significantly modify the shape of the absorption spectrum in FIG. 1.

Formation of charged excitons, due to the binding of an excess carrier to a photo-excited electron-hole pair, increases the absorption at photon energy A, so leading to the formation of an even higher density of photo-excited background charge. Hence the system switches into a state where the absorption at photon energy A is enhanced, resembling the dashed line in FIG. 1, and the intensity of light transmitted by the structure drops (point b on FIG. 28).

The intensity of the transmitted light then rises less rapidly with further increase(point c intensity (point c in FIG. 28). If the input intensity is decreased again, the absorption state which is more absorbing at photon energy A is supported to a lower input power. As the input power is decreased, eventually insufficient electron and holes are photo-excited to support the presence of charged excitons in the well, and the system switches to become more transparent at photon energy A (point d on FIG. 28).

The device can also be operated at photon energy B as shown in FIG. 25, for which it displays rather different behavior shown in FIG. 29. At this photon energy, the absorption is relatively large at low incident light intensity. Increasing the incident intensity increases the number of photo-excited electrons and holes in the structure, whose presence tends to reduce the absorption of the neutral exciton energy B, producing a super-linear increase in the transmitted intensity. If the incident intensity is decreased again, the system switches back to the relatively high absorbing state again, but at a smaller input power.

Thus, in both FIGS. 28 and 29, for certain input powers, the structure can have two possible values for the transmitted intensity, depending on whether the incident intensity had previously been higher or lower.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A bistable optical element comprising an optical path region including a plurality of quantum well layers alternating with respective barrier layers of higher bandgap semiconductor material than the quantum well layers, for providing bistability in the emergent intensity of an optical beam transmitted through the optical path region, wherein photon energy of incident light to be modulated is in a range of an absorption profile of a charged exciton, and for certain input powers of the incident light, two possible values of transmitted light intensity are possible, depending on a value of previous incident light intensity, and further comprising a light source for providing the optical beam, and wherein the light source has a wavelength such that the photon energy corresponds to or is in the region of the energy of charged excitons.

2. An element according to claim 1, wherein the optical path region comprises from five to fifty quantum well layers.

3. An element according to claim 1, wherein the optical path region is disposed between respective upper and lower cladding regions.

4. An element according to claim 3, wherein a waveguide structure is provided for defining an optical path for the optical beam through the optical path region.

5. An element according to claim 3, wherein a waveguide structure is provided for defining an optical path for the optical beam through the optical path region.

6. An element according to claim 1, wherein the light source has a wavelength such that the photon energy corresponds to or is in the region of the energy of neutral excitons.

7. An element according to claim 1, further comprising a light source for providing the optical beam so that it directs the beam substantially normal to or at an oblique angle to the quantum well layers.

8. An element according to claim 1, further comprising an optical detector for detecting the intensity of an emergent optical beam.

* * * * *